(12) United States Patent
Sato et al.

(10) Patent No.: US 9,639,108 B2
(45) Date of Patent: May 2, 2017

(54) POWER SUPPLY CIRCUIT

(71) Applicant: Rohm Co., Ltd., Kyoto (JP)

(72) Inventors: Kiminobu Sato, Kyoto (JP); Shinji Kawata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 470 days.

(21) Appl. No.: 14/255,053

(22) Filed: Apr. 17, 2014

(65) Prior Publication Data

US 2014/0312872 A1    Oct. 23, 2014

(30) Foreign Application Priority Data

Apr. 19, 2013  (JP) ................................. 2013-087999
Apr. 14, 2014  (JP) ................................. 2014-082530

(51) Int. Cl.
  *G05G 1/00*     (2006.01)
  *G05F 5/00*     (2006.01)
  *G05F 1/565*    (2006.01)
  *G01R 19/165*   (2006.01)

(52) U.S. Cl.
  CPC ............. *G05F 5/00* (2013.01); *G01R 19/165* (2013.01); *G05F 1/565* (2013.01)

(58) Field of Classification Search
  CPC ........... G01R 19/165; G01R 19/16519; G01R 19/16538; G01R 19/16552; G01R 19/16576; G05F 1/56; G05F 1/562; G05F 1/565; G05F 1/571; G05F 1/569; G05F 1/575; G05F 5/00; G06F 1/26
  See application file for complete search history.

(56) References Cited

U.S. PATENT DOCUMENTS

| 2009/0164807 A1* | 6/2009 | Chi .......................... G06F 1/26 713/300 |
| 2009/0237048 A1* | 9/2009 | Hou ........................ G05F 1/575 323/282 |
| 2012/0176179 A1* | 7/2012 | Harders ............... H03K 17/962 327/517 |
| 2012/0313606 A1* | 12/2012 | Jung ........................ G05F 1/56 323/283 |
| 2014/0152275 A1* | 6/2014 | Lee ......................... G05F 1/468 323/271 |

FOREIGN PATENT DOCUMENTS

JP           04-225174      8/1992

* cited by examiner

*Primary Examiner* — Jermele M Hollington
*Assistant Examiner* — Dustin Dickinson
(74) *Attorney, Agent, or Firm* — Fish & Richardson P.C.

(57) ABSTRACT

A power supply circuit 1 includes an output circuit that generates an output voltage by performing a power supply operation based on an input voltage, an output terminal to which, after start-up of the power supply operation, the output voltage is applied, and a control circuit that causes a test current to flow between the output terminal and a ground. The control circuit detects, as a test voltage, a voltage at the output terminal in a test period in which the test current is caused to flow. When the test voltage at a predetermined judgment timing is lower than a judgment voltage, the control circuit judges that an output capacitor is connected and thus enables the power supply operation.

12 Claims, 22 Drawing Sheets

START-UP CONTROL SIGNAL
(START-UP ENABLING/DISABLING SIGNAL)

WHEN OUTPUT CAPACITOR IS CONNECTED

WHEN OUTPUT CAPACITOR IS UNCONNECTED

FIG.8

| OPEN_LATCH | OPEN_TIME | OPEN_DET | POWER SUPPLY OPERATION |
|---|---|---|---|
| Lo | Lo | Hi | START-UP DISABLED |
| Lo | Hi | | |
| Hi | Lo | | |
| Hi | Hi | Lo | START-UP ENABLED |

POWER SUPPLY CIRCUIT

CROSS-REFERENCE TO RELATED APPLICATIONS

This application is based on and claims the benefit of priority from the following Japanese Patent Applications, the contents of which are hereby incorporated by reference.

(1) Japanese Patent Application No. 2013-087999 (filing date: Apr. 19, 2013)

(2) Japanese Patent Application No. 2014-082530 (filing date: Apr. 14, 2014)

BACKGROUND OF THE INVENTION

Field of the Invention

The present invention relates to a power supply circuit.

Description of Related Art

In a power supply circuit that obtains an output voltage from an input voltage by performing a power supply operation, an output capacitor is connected to an output terminal thereof (see JP-A-H4-225174, etc.).

For example, in a power supply circuit formed as a linear regulator, when such an output capacitor is not connected to an output terminal thereof, an output voltage becomes unstable (for example, an output voltage oscillates or varies significantly due to an abrupt load variation). A continued operation of the power supply circuit in such an unstable state may destabilize an operation of any other circuit than the power supply circuit and, in some cases, leads to deterioration or breakage of a circuit element in the power supply circuit or a circuit element outside the power supply circuit.

SUMMARY OF THE INVENTION

In view of the above-described problems found by the inventors of the present application, the present invention has as its object to provide a power supply circuit that suppresses a power supply operation in an unstable state.

A power supply circuit according to the present invention includes an output circuit that generates an output voltage by performing a power supply operation based on an input voltage, an output terminal to which, after start-up of the power supply operation, the output voltage is applied, and a control circuit that sets a test period in which a predetermined test current is caused to flow between the output terminal and a reference potential line, detects, as a test voltage, a voltage at the output terminal in the test period, and controls, based on the test voltage, whether or not to enable the power supply operation.

Other features, constituent elements, operational steps, advantages, and characteristics of the present invention will be further clarified by the following detailed descriptions of best modes and appended drawings related thereto.

BRIEF DESCRIPTION OF THE DRAWINGS

FIG. 8 is a diagram showing a relationship between statuses of a plurality of signals and a start-up status of a power supply operation.

DETAILED DESCRIPTION OF PREFERRED EMBODIMENTS

Figure 1:
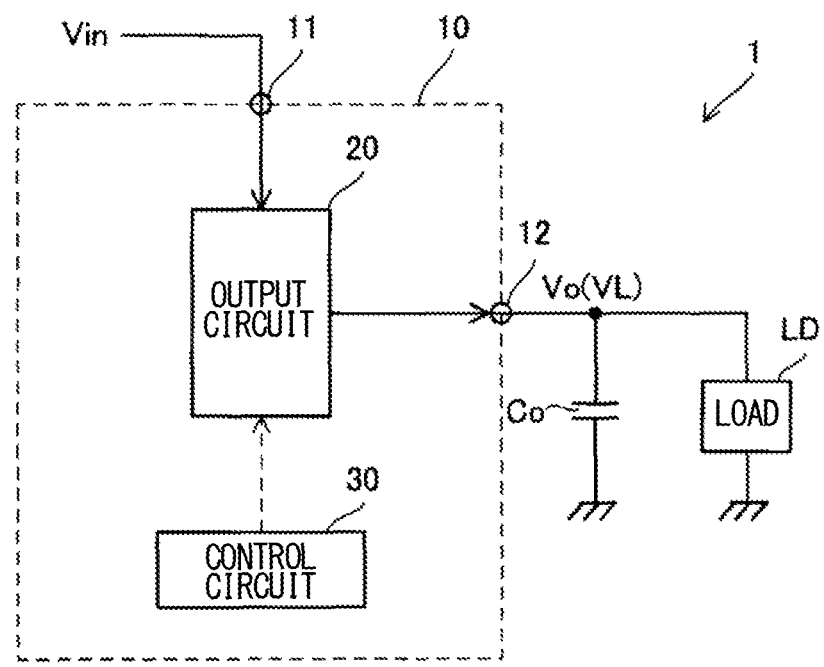
FIG. 1 is a schematic configuration diagram of a power supply circuit according to an embodiment of the present invention.

With reference to the appended drawings, the following specifically describes examples of an embodiment of the present invention. In the drawings to which reference is made, like parts are denoted by the same reference characters, and duplicate descriptions thereof are omitted in principle. In this specification, for the sake of descriptive simplicity, information, signals, physical quantities, quantities of state, members, or the like may be referred to by using reference symbols or characters, in which case respective names of the information, signals, physical quantities, quantities of state, members, or the like corresponding to the reference symbols or characters are omitted or presented in abbreviated forms.

FIG. 1 is a schematic configuration diagram of a power supply circuit 1 according to an embodiment of the present invention. The power supply circuit 1 generates from a direct current input voltage Vin a direct current output voltage Vo having a voltage value different from that of the input voltage Vin. The power supply circuit 1 is formed to include a power supply IC 10 that is a semiconductor integrated circuit. The power supply IC 10 itself may be regarded as the power supply circuit 1. The IC 10 includes an input terminal 11 to which the input voltage Vin is applied, an output circuit 20 that generates the output voltage Vo by performing a power supply operation based on the input voltage Vin, an output terminal 12 to which the output voltage Vo is applied after start-up of the power supply operation, and a control circuit 30 that performs start-up control of the power supply operation, and so on. In principle, an output capacitor Co having a capacitance not less than a predetermined capacitance CTH is connected to the output terminal 12. Reference character LD denotes a load that is connected to the output terminal 12.

In this embodiment, the input voltage Vin and the output voltage Vo are each a positive voltage. Furthermore, a potential used as a reference of various voltages such as the input voltage Vin and the output voltage Vo is referred to as a reference potential, and a wiring line, a metal layer, or a point that has the reference potential is referred to as a ground (reference potential line). The reference potential has a value of 0 V (volt). When the output capacitor Co is connected, a positive electrode of the output capacitor Co is connected to the output terminal 12, and a negative electrode of the output capacitor Co is connected to the ground.

Furthermore, in the following, a voltage at the output terminal 12 as seen from the ground is referred to also by using a reference symbol VL. After start-up of the power supply operation, the voltage VL is the output voltage Vo obtained through the power supply operation. Before start-up of the power supply operation, as the voltage VL, a non-zero voltage obtained not through the power supply operation may be applied to the output terminal 12 (this will be detailed later).

Figure 2:
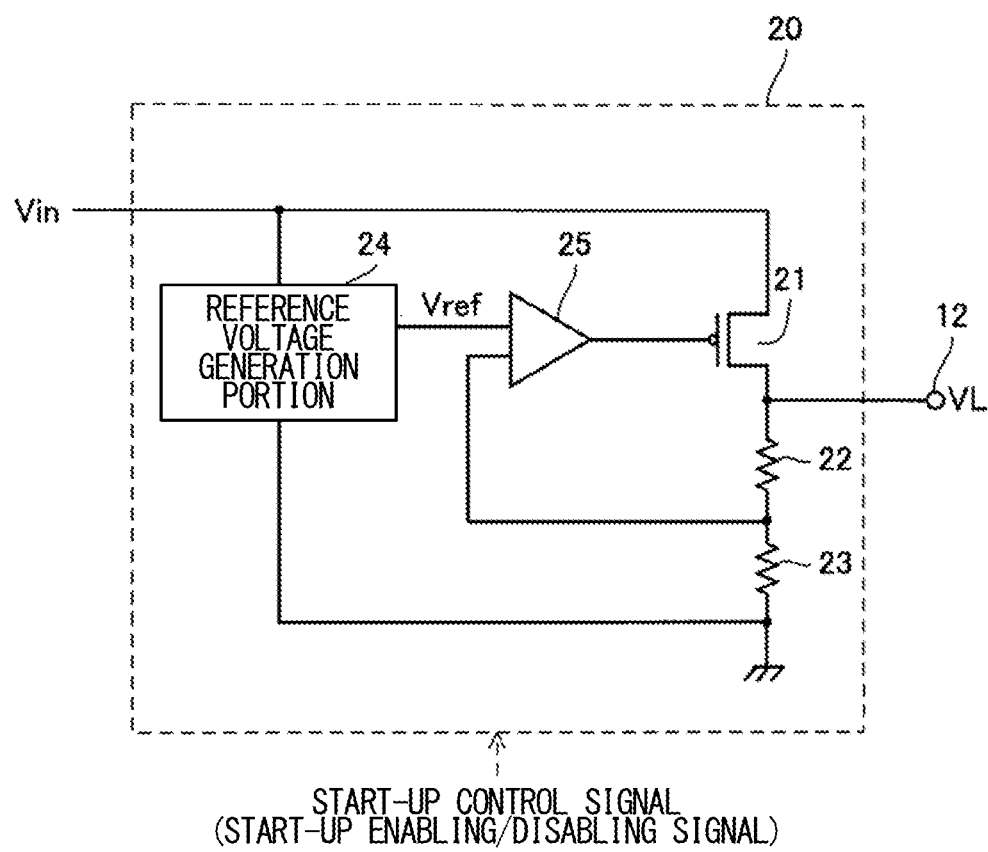
FIG. 2 is an internal circuit diagram of an output circuit shown in FIG. 1.

The power supply circuit 1 is formed as a linear regulator. FIG. 2 shows a circuit diagram of the output circuit 20 for forming the linear regulator. The output circuit 20 in FIG. 2 includes an output transistor 21, voltage division resistors 22 and 23, a reference voltage generation portion 24 that generates, based on the input voltage Vin, a reference voltage Vref, and an error amplifier 25 that is formed of an operational amplifier. In a circuit example shown in FIG. 2, the output transistor 21 is a P-channel type MOSFET (metal-oxide-semiconductor field-effect transistor). The input voltage Vin is applied to a source of the FET 21, and a drain of the FET 21 is connected to the output terminal 12 and also to the ground via a series circuit composed of the voltage division resistors 22 and 23. More specifically, the drain of the FET 21 is connected to one end of the voltage division resistor 22, and the other end of the voltage division resistor 22 is connected to the ground via the voltage division resistor 23. The error amplifier 25 controls a gate potential of the FET 21 so that an error between the reference voltage Vref and a voltage at a connection point between the voltage division resistors 22 and 23 (namely, a voltage obtained by dividing the voltage VL by a ratio depending on resistance values of the resistors 22 and 23) becomes zero.

The power supply operation performed in the output circuit 20 includes an operation in which power based on the input voltage Vin is outputted from the output terminal 12 to the load LD via the output transistor 21. Before start-up of the power supply operation, the output transistor 21 is controlled so that power based on the input voltage Vin is not outputted from the output terminal 12 to the load LD via the output transistor 21 (i.e. the output transistor 21 is maintained in a shut-off state). The control circuit 30 in FIG. 1 supplies, to the output circuit 20, a start-up control signal to control whether or not to start up the power supply operation. The start-up control signal is a start-up enabling signal to enable start-up of the power supply operation or a start-up disabling signal to disable start-up of the power supply operation. Thus, in a case where the start-up enabling signal is supplied to the output circuit 20, the power supply operation is started up, whereas in a case where the start-up disabling signal is supplied to the output circuit 20, the power supply operation is not started up. A state where the start-up enabling signal is not supplied corresponds to a state where the start-up disabling signal is supplied. The output circuit 20 is configured so that the output transistor 21 is maintained to be off until the start-up enabling signal is supplied (i.e. so that the shut-off state between the drain and the source of the FET 21 is maintained). For example, a value of the reference voltage Vref may be controlled depending on the start-up control signal (after start-up of the power supply operation, the reference voltage Vref has a predetermined value depending on a target value of the output voltage Vo).

As is well known, in a case of a linear regulator, connecting the output capacitor Co to the output terminal 12 (hereinafter, referred to simply as connecting the output capacitor Co) is essential, and when the power supply operation is started up in a state where the output capacitor Co is not connected, the output voltage Vo becomes unstable (for example, the output voltage Vo oscillates or varies significantly due to an abrupt load variation). The IC 10 has a function of, prior to start-up of the power supply operation, checking whether or not the output capacitor Co is connected.

Figure 3:
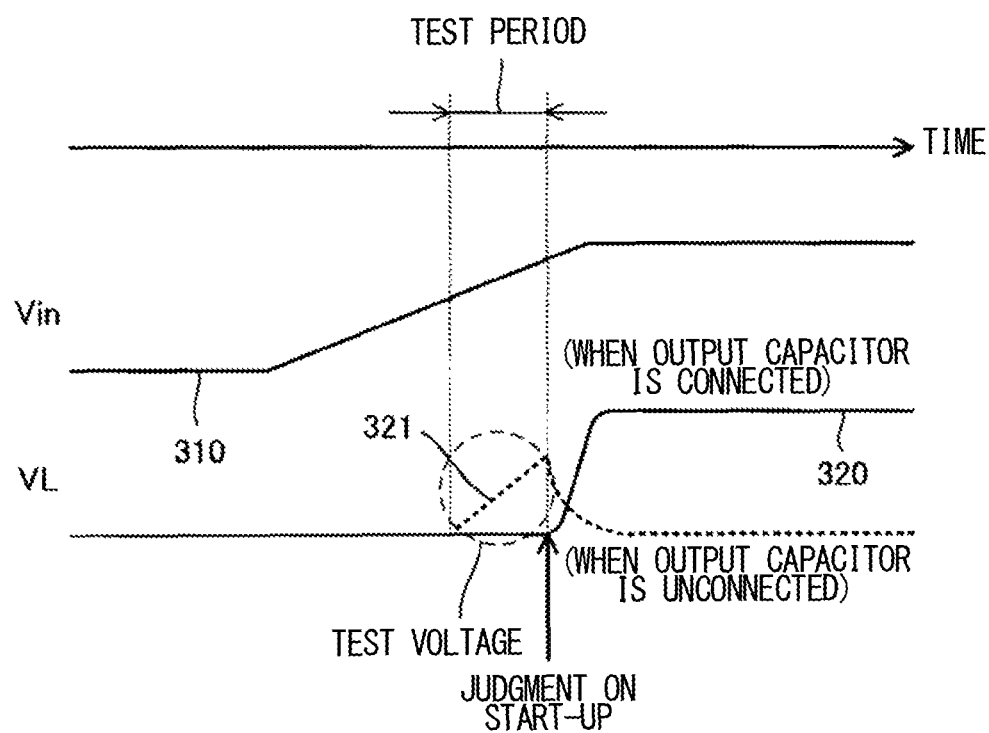
FIG. 3 is a diagram showing waveforms of an input voltage and a voltage at an output terminal, which are related to a test period, according to the embodiment of the present invention.

A period for performing such checking, which is set to precede start-up of the power supply operation, is referred to as a test period. In FIG. 3, a solid line 310 indicates a waveform of the input voltage Vin. A solid line 320 indicates a waveform of the voltage VL when the output capacitor Co is connected, and a broken line 321 indicates a waveform of the voltage VL when the output capacitor Co is unconnected. Before the test period, the solid line 320 and the broken line 321 coincide with each other. Upon the input voltage Vin rising from 0 V (volt) to reach a predetermined value, the test period is started. A voltage that occurs as the voltage VL in the test period (namely, a potential at the output terminal 12 as seen from the ground) is referred to particularly as a test voltage. In the test period, the control circuit 30 causes a predetermined test current to flow between the output terminal 12 and the ground. It is assumed that the test current flows from the output terminal 12 to the ground. While it is preferable that a constant current be used as the test current, the test current does not necessarily have to be a constant current. A time length (length of time) of the test period may be a predetermined length. It is appropriate that, after completion of the test period, the control circuit 30 stop supplying the test current.

Figure 4A:
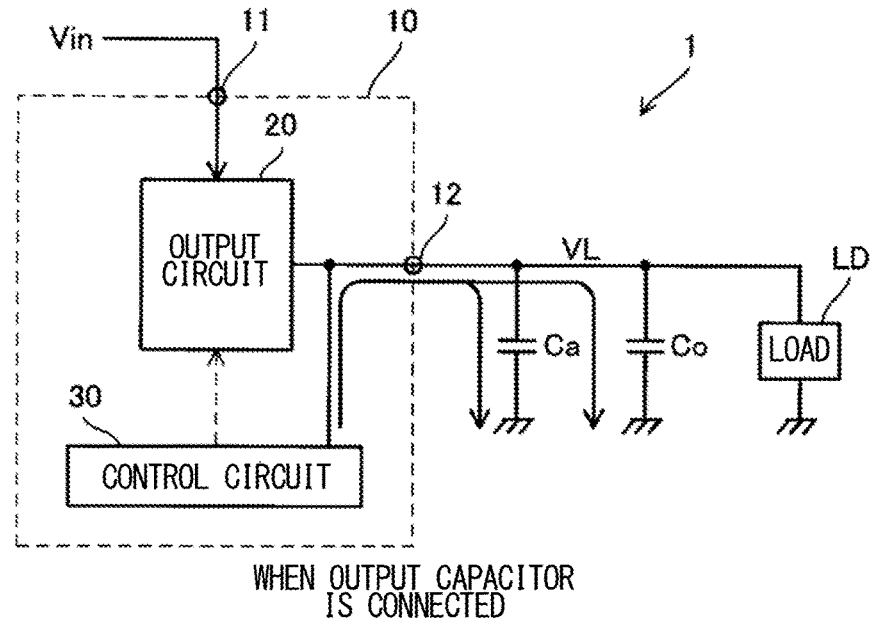
FIG. 4 is a diagram showing how a test current flows when an output capacitor is connected/unconnected.
Figure 4B:
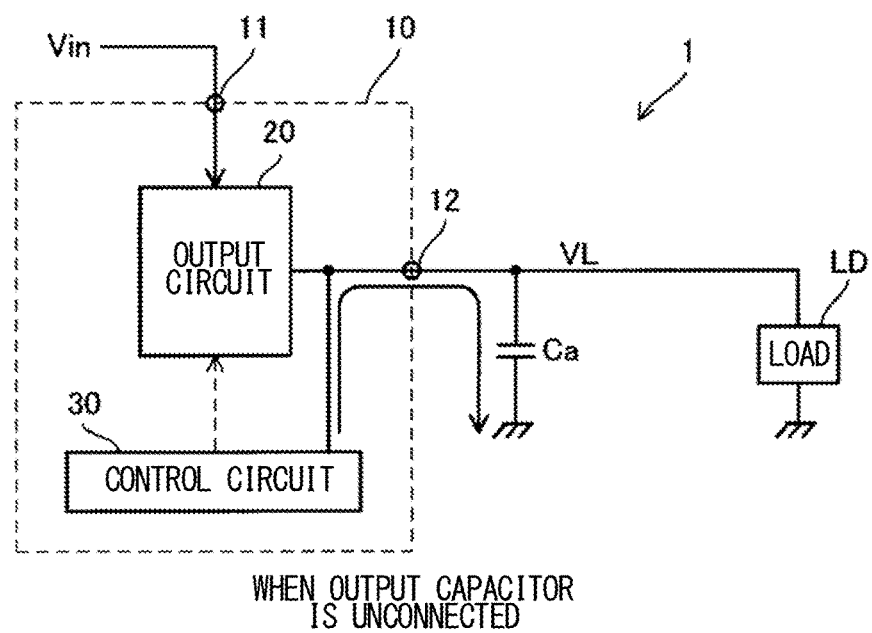

As shown in FIG. 4(a), when the output capacitor Co is connected, the test current flows to the ground via the output terminal 12 and a parallel circuit composed of a parasite capacitor Ca and the output capacitor Co. On the other hand, as shown in FIG. 4(b), when the output capacitor Co is unconnected, the test current flows to the ground via the output terminal 12 and the parasite capacitor Ca (since the output capacitor Co does not exist, naturally, the test current does not flow through the output capacitor Co). It is assumed that, before start-up of the power supply operation, the load LD consumes no power. The parasite capacitor Ca is a parasite capacitor that includes a parasite capacitance of a pad of the output terminal 12 and a wiring capacitance of a wiring line connected to the output terminal 12, and has a capacitance that is sufficiently smaller than a capacitance of the output capacitor Co and the above-described predetermined capacitance CTH.

In the test period, the test current flows, thus causing the test voltage to rise from 0 V as a starting point. At this time, compared with the case where the output capacitor Co is connected, when the output capacitor Co is not connected, a rising rate of the test voltage increases (see the solid line 320 and the broken line 321 in FIG. 3). Accordingly, by detecting the test voltage, the control circuit 30 can judge whether or not the output capacitor Co is connected. The control circuit 30 judges, based on the test voltage, whether or not the output capacitor Co is connected to the output terminal 12. When having judged that the output capacitor Co is connected, the control circuit 30 supplies the start-up enabling signal to the output circuit 20 so that the power supply operation is started, while when having judged that the output capacitor Co is not connected, the control circuit 30 does not supply the start-up enabling signal to the output circuit 20 so that start-up of the power supply operation is disabled (in other words, the control circuit 30 maintains, even after the test period, its supply of the start-up disabling signal to the output circuit 20, which it has been continuously carrying out since before and during the test period, thus disabling start-up of the power supply operation).

When the power supply operation is started up in the state where the output capacitor Co is not connected, the power supply circuit 1 operates in an unstable state. A continued operation of the power supply circuit 1 in the unstable state may destabilize an operation of any other circuit than the power supply circuit and, in some cases, leads to deterioration or breakage of a circuit element in the power supply circuit or a circuit element outside the power supply circuit. When, however, as in this embodiment, it is judged whether or not the output capacitor Co is connected, and based on a result of the judgment, start-up of the power supply operation in a state where the output capacitor Co is unconnected is disabled, start-up of the power supply circuit 1 in an unstable state is suppressed, and thus detrimental effects (including an unstable operation of any other circuit, breakage of a circuit element, and so on) that may result from the start-up can be suppressed.

The following are a plurality of examples for describing more specific configuration examples, operation examples, and so on of the power supply circuit 1 based on the aforementioned configuration and operation.

First Example

Figure 5:
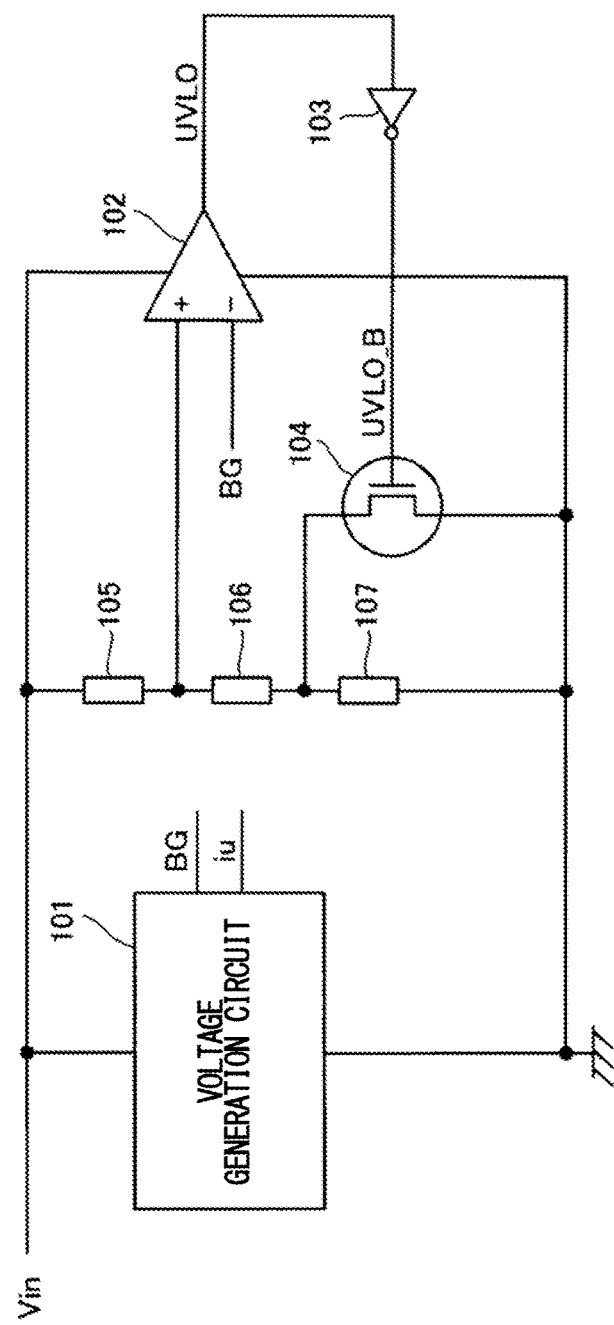
FIG. 5 is a partial circuit diagram of a power supply circuit according to a first example of the present invention.
Figure 6:
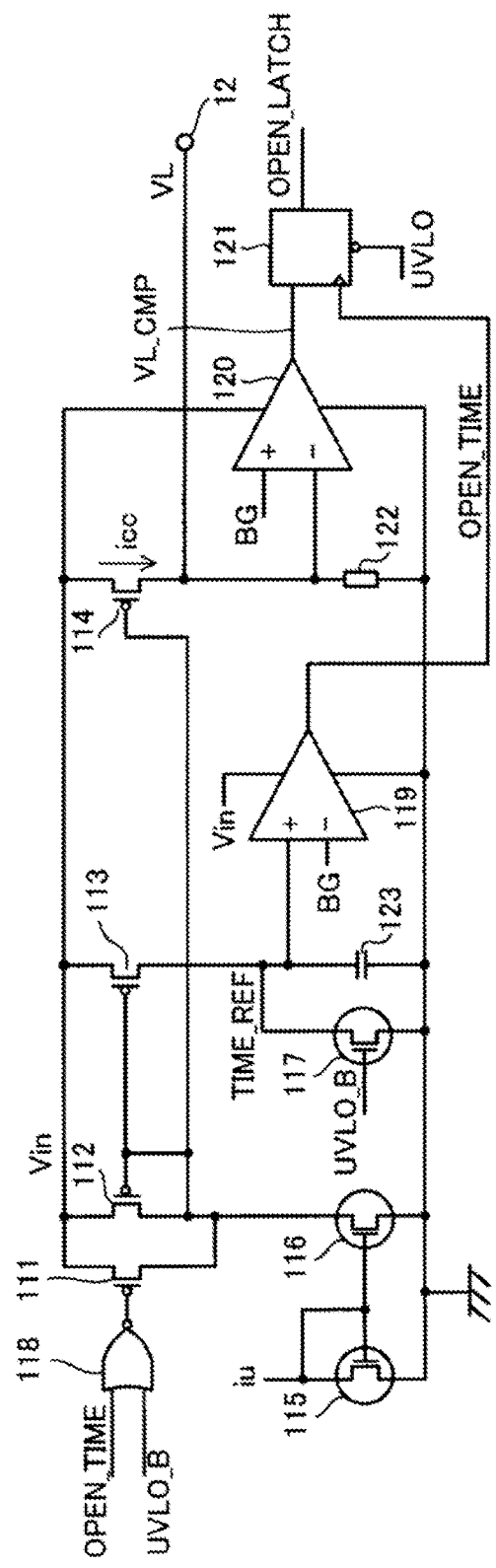
FIG. 6 is a partial circuit diagram of the power supply circuit according to the first example of the present invention.
Figure 7:
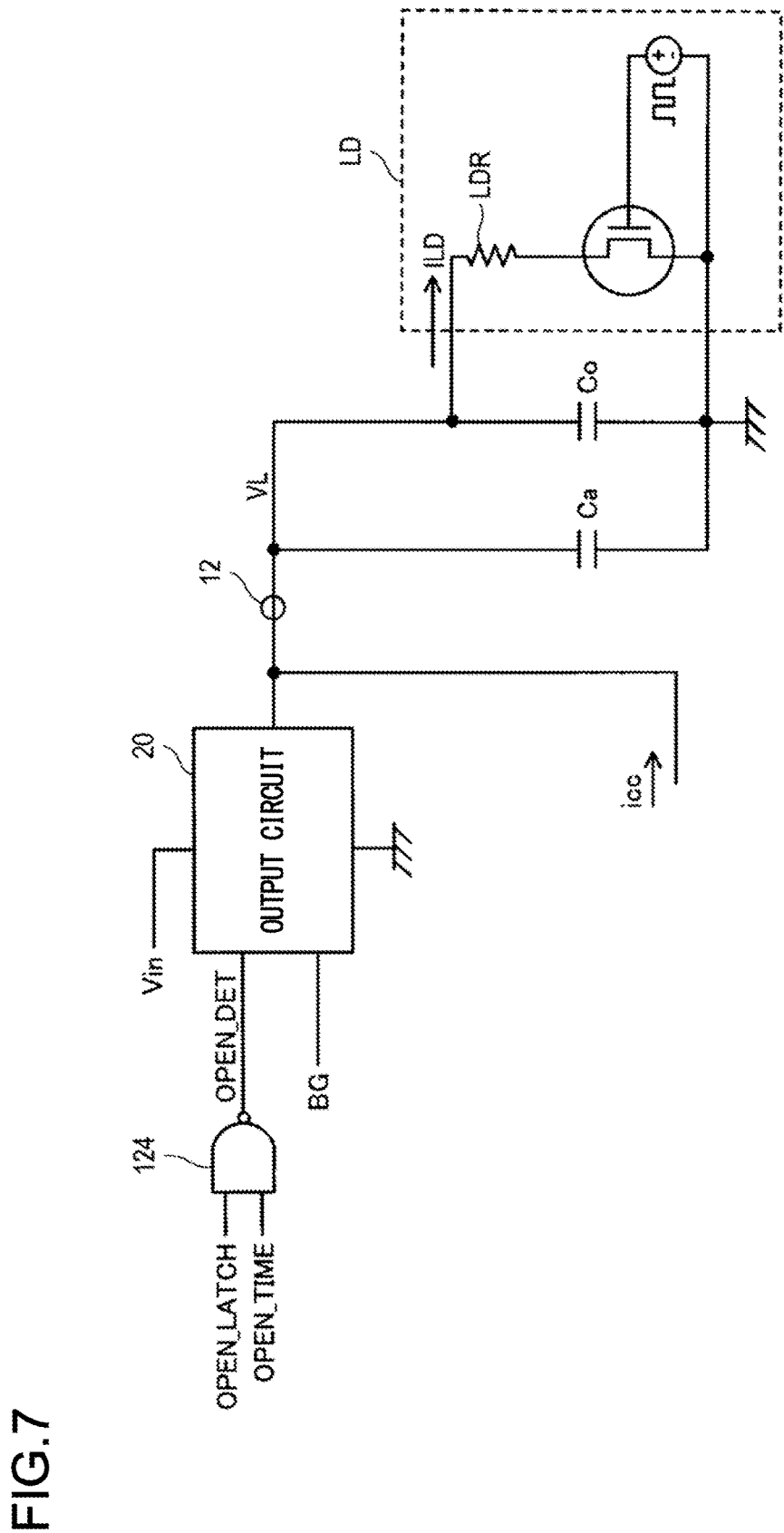
FIG. 7 is a partial circuit diagram of the power supply circuit according to the first example of the present invention.

A description is given of a first example of the power supply circuit 1. FIGS. 5 to 7 show partial circuit diagrams of a power supply circuit 1 according to the first example, and configurations shown in FIGS. 5 to 7, respectively, as a whole constitute the power supply circuit 1.

Each of comparators and logic circuits shown in FIGS. 5 to 7 is driven by using the input voltage Vin as a drive voltage. A signal outputted from an arbitrary one of the comparators or an arbitrary one of the logic circuits is a voltage signal of a high level or a voltage signal of a low level having a potential lower than that of the high-level voltage signal and a logic value different from that of the high-level voltage signal. Hereinafter, the voltage signal, when having a high signal level, is expressed as being high ("Hi"), and when having a low signal level, is expressed as being low ("Lo"). Furthermore, FIG. 8 shows a relationship between signals OPEN_LATCH and OPEN_TIME and a signal OPEN_DET (see FIG. 7), and a relationship between the signal OPEN_DET and a power supply operation.

First, the description is directed to the circuit of FIG. 5. The control circuit 30 includes parts referred to by using reference characters 101 to 107. A FET 104 is an N-channel type MOSFET. A voltage generation circuit 101 generates from the input voltage Vin, by using a semiconductor band gap voltage, a predetermined constant voltage BG lower than the input voltage Vin to output it, and also generates a constant current iu to output it. The input voltage Vin is applied to a series circuit composed of resistors 105, 106, and 107. Among the resistors 105, 106, and 107, the resistor 105 is located on the highest voltage side, and the resistor 107 is located on the lowest voltage side. A non-inverting input terminal of a comparator 102 is connected to a connection point between the resistors 105 and 106, and the constant voltage BG is applied to an inverting input terminal of the comparator 102. A signal UVLO is outputted from an output terminal of the comparator 102, and a logic-inverted signal UVLO_B of the signal UVLO is generated by a NOT circuit 103. The signal UVLO_B is supplied to a gate of the FET 104. A drain of the FET 104 is connected to a connection point between the resistors 106 and 107, and a source thereof is connected to a ground.

Thus, in the circuit shown in FIG. 5, the input voltage Vin rises from 0 V, and the constant voltage BG thus is generated and outputted, after which the input voltage Vin further rises to reach a first predetermined voltage, and this causes the output signal UVLO of the comparator 102 to switch from low to high. Thereafter, upon the input voltage Vin dropping to a second predetermined voltage, the output signal UVLO switches from high to low. Due to the FET 104 and the resistors 105 to 107, the second predetermined voltage has a value lower than that of the first predetermined voltage. That is, hysteresis is imparted to a change of the output signal UVLO. When the output signal UVLO is low, the signal OPEN_LATCH is made low by a latch circuit 121 shown in FIG. 6, and the signal OPEN_DET becomes high through a NAND circuit 124 shown in FIG. 7 (see FIG. 8). As a result, the power supply operation at the output circuit 20 is not carried out. Thus, it can be said that the IC 10 includes a reduced-voltage protection circuit that stops the power supply operation when the input voltage Vin is not higher than a predetermined voltage, and the reduced-voltage protection circuit includes the comparator 102, the NOT circuit 103, the FET 104, and the resistors 105 to 107.

Next, the description is directed to the circuits of FIGS. 6 and 7. The control circuit 30 further includes parts referred to by using reference characters 111 to 124. FETs 111 to 114 are P-channel type MOSFETs, and FETs 115 to 117 are N-channel type MOSFETs. A two-input NOR (negative OR) circuit 118 outputs a negative OR signal of the signals OPEN_TIME and UVLO_B to a gate of the FET 111. The input voltage Vin is applied to each of sources of the FETs 111 to 114. Gates of the FETs 112 to 114 are connected in common, and drains of the FETs 111, 112, and 116 are connected in common. A gate and a drain of the FET 115 and a gate of the FET 116 are connected in common. Sources of the FETs 115 to 117 are connected to the ground. Drains of the FETs 113 and 117 are connected in common. The single UVLO_B is inputted to a gate of the FET 117.

The drain of the FET 113 is connected to a non-inverting input terminal of a comparator 119 and to the ground via a capacitor 123. A voltage at the non-inverting input terminal of the comparator 119 is referred to as a voltage TIME_REF. A drain of the FET 114 is connected to an inverting input terminal of a comparator 120 and to the ground via a resistor 122. The constant voltage BG is applied to each of an inverting input terminal of the comparator 119 and a non-inverting input terminal of the comparator 120. The comparator 119 outputs, as the signal OPEN_TIME, a result of a comparison between the voltage TIME_REF and the constant voltage BG. Furthermore, the drain of the FET 114 is connected to the output terminal 12. Accordingly, the voltage VL is applied to the inverting input terminal of the comparator 120. The latch circuit 121 holds a level of an output signal VL_CMP of the comparator 120 at a timing when the signal OPEN_TIME switches from low to high, and outputs, as the signal OPEN_LATCH, a signal having the level thus held. In a case, however, where, after the level has been held, the signal UVLO being low is inputted to the latch circuit 121, the level is released from being held, so that the signal OPEN_LATCH becomes low.

The two-input NAND (negative AND) circuit 124 in FIG. 7 receives inputs of the signals OPEN_LATCH and OPEN_TIME, and supplies the signal OPEN_DET that is a negative AND signal of these signals to the output circuit 20. The signal OPEN_DET being high corresponds to the start-up disabling signal, and the signal OPEN_DET being low corresponds to the start-up enabling signal (see FIG. 8). The output circuit 20 can generate, based on the constant voltage BG, the reference voltage Vref, or can use the constant voltage BG as the reference voltage Vref. FIG. 7 shows a model circuit of the load LD. A current flowing from the output terminal 12 to the ground via the load LD is referred to by using a reference symbol ILD. In waveform examples shown in after-mentioned FIGS. 9 to 12, respectively, after a lapse of a given time from completion of the test period, a state where the output terminal 12 is connected to the ground via a resistor LDR and a state where the output terminal 12 is opened occur alternately and repeatedly.

When the voltage generation circuit 101 in FIG. 5 is outputting the constant voltage BG and also outputting the constant current iu, the constant current iu flows as a drain current of the FET 115 in FIG. 6. The FETs 115 and 116 are the same in their characteristics and constitute a current mirror circuit in which the FET 115 serves as a FET on a current input side. Accordingly, when the constant current iu is flowing through the FET 115, a drain current having the same current value as that of the constant current iu flows also through the FET 116. When at least one of the signals OPEN_TIME and UVLO_B is high, the FET 111 is turned on, and thus the drain current of the FET 116 flows via the FET 111, with no current flowing through the FET 112.

On the other hand, when both of the signals OPEN_TIME and UVLO_B are low, the FET 111 is turned off, and thus the drain current of the FET 116 (namely, the constant current) flows via the FET 112. The FETs 112 to 114 are the same in their characteristics and constitute a current mirror circuit in which the FET 112 serves as a FET on a current input side. Accordingly, when the constant current flows through the FET 112, a constant current depending on the current flowing through the FET 112 flows also through each of the FETs 113 and 114. When the FET 117 is off, the constant current that passes through the FET 113 is used to charge the capacitor 123. A constant current icc that passes through the FET 114 is used to charge the parasite capacitor Ca and the output capacitor Co or to charge the parasite capacitor Ca. The aforementioned test period corresponds to a period in which the constant current icc flows.

Figure 9:
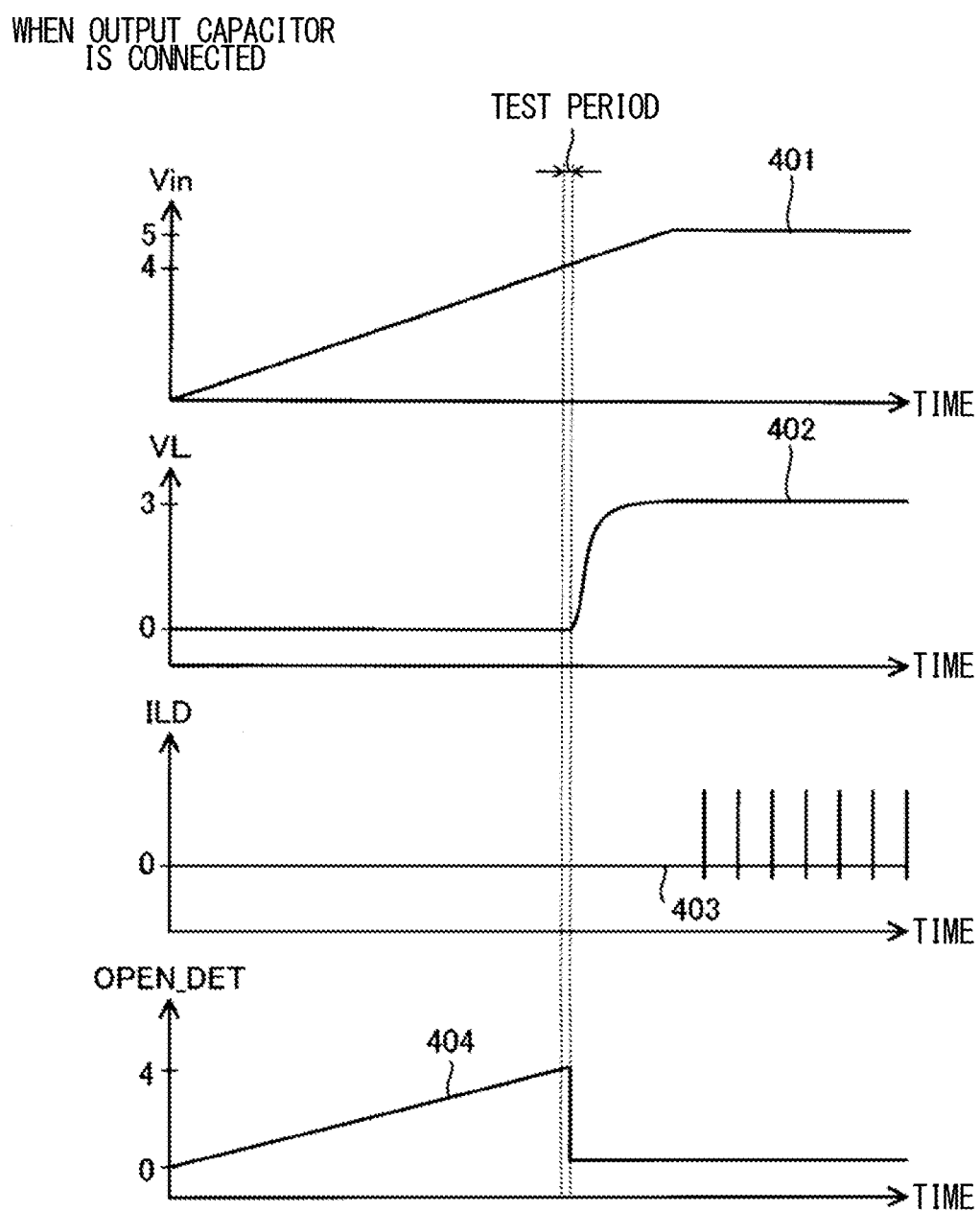
FIG. 9 is a waveform diagram of various types of voltages, a current, and a signal when an output capacitor is connected.
Figure 10:
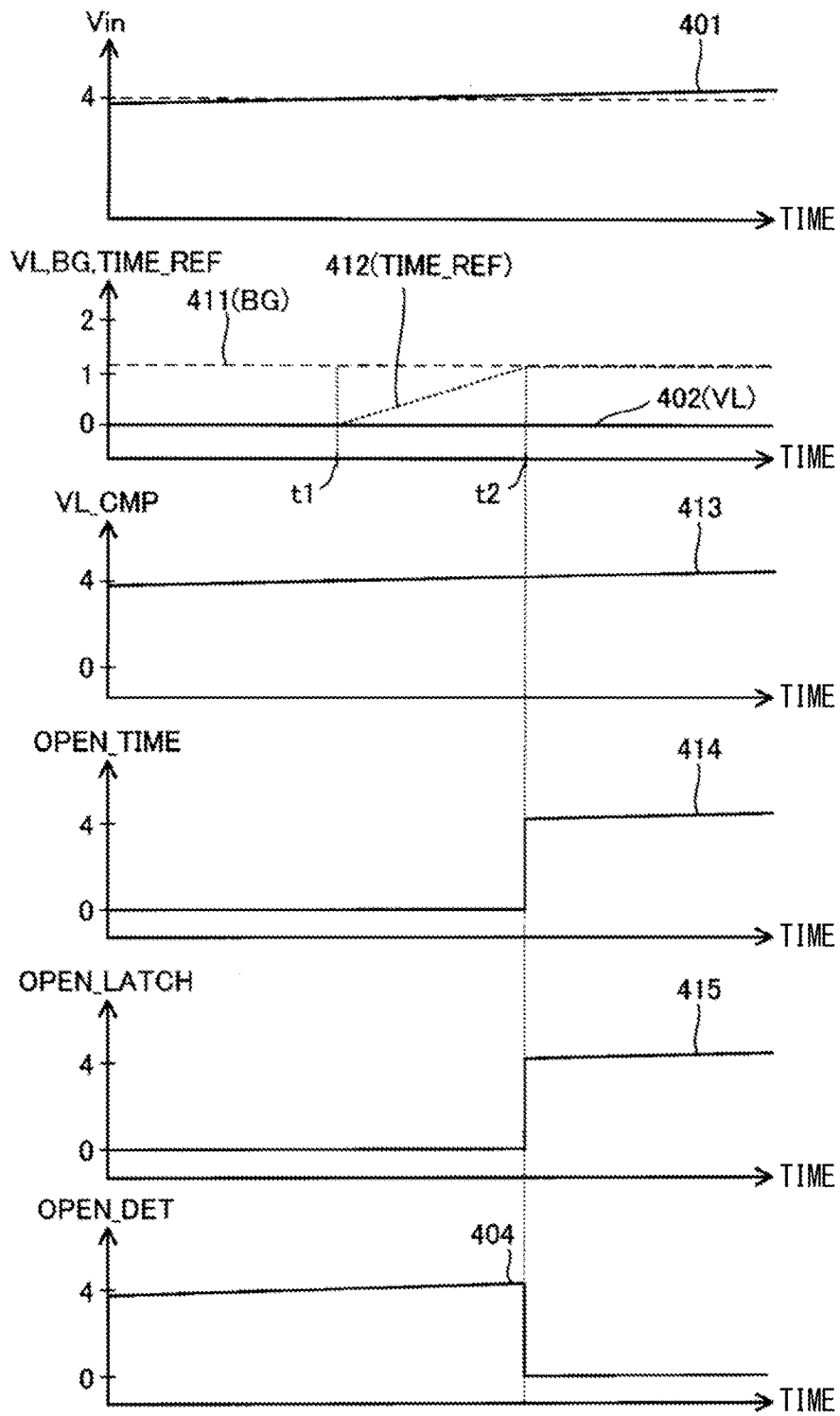
FIG. 10 is an enlarged waveform diagram of various types of voltages and signals when the output capacitor is connected.

With reference to FIGS. 9 and 10, a description is given of statuses of the signals around the time of start-up of the power supply operation in a state where the output capacitor Co is connected (hereinafter, referred to as an output capacitor connected state). In FIG. 9, waveforms 401 to 404 are waveforms, in the output capacitor connected state, of the input voltage Vin, the voltage VL, the load current ILD, and the signal OPEN_DET, respectively. An example shown in FIGS. 9 and 10 assumes that the input voltage Vin rises from 0 V to 5 V and then becomes stable, and that the output voltage VL (Vo) after start-up of the power supply operation has a value of about 3 V.

FIG. 10 shows enlarged views of the waveforms 401, 402, and 404 in and around the test period. Furthermore, in FIG. 10, waveforms 411 to 415 are waveforms, in and around the test period in the output capacitor connected state, of the voltages BG and TIME_REF and the signals VL_CMP, OPEN_TIME, and OPEN_LATCH, respectively.

Upon the input voltage Vin rising from 0 V starting from a state, as a starting point, where both of the voltages TIME_REF and VL have a value of 0 V, first, while the signal UVLO is maintained to be low, the constant voltage BG and the constant current iu are generated and outputted. At this stage, since the signal UVLO_B is high, no current flows through the FETs 112 to 114. After that, upon the input voltage Vin reaching a predetermined UVLO release voltage (about 4 V) at a timing t1, the signal UVLO switches from low to high, as a result of which a constant current starts to flow through each of the FETs 113 and 114. At this stage, since the signal UVLO_B is low, the FET 117 is off. Accordingly, the constant current that passes through the FET 113 is used to charge the capacitor 123, thus gradually increasing the voltage TIME_REF (see the waveform 412). On the other hand, the constant current icc that passes through the FET 114 is used to charge the capacitors Ca and Co, thus gradually increasing the voltage VL. In this case, however, since the capacitor Co has a sufficiently large capacitance, before start-up of the power supply operation, the voltage VL is maintained at almost 0 V.

Then, at a timing t2 when the voltage TIME_REF has become not lower than the constant voltage BG, the signal OPEN_TIME switches from low to high (see the waveform 414; in FIG. 10, after the timing t2, the waveforms 411 and 412 coincide with each other). Upon the signal OPEN_TIME switching from low to high, the FET 111 is turned on through the NOR circuit 118, and thus supply of the constant current that has passed through the FET 113 and supply of the constant current icc that has passed through the FET 114 are stopped. Since in the output capacitor connected state, the output capacitor Co has a sufficiently large capacitance with respect to a total amount of the constant current icc in the test period, the voltage VL at the timing t2 is lower than the constant voltage BG. Because of this, the signal VL_CMP at the timing t2 is high (see the waveform 413). The latch circuit 121 latches a level of the signal VL_CMP at the timing t2 and outputs the signal OPEN_LATCH having the level thus latched. Accordingly, in the output capacitor connected state, at the timing t2, the signal OPEN_LATCH switches from low to high. As a result, the signal OPEN_DET switches from high to low, so that the power supply operation by the output circuit 20 is started up (see FIG. 8).

When the output capacitor Co is connected, because the constant current icc is supplied in the test period, the power supply operation is started up in a state where the output capacitor Co has been charged to some extent.

Figure 11:
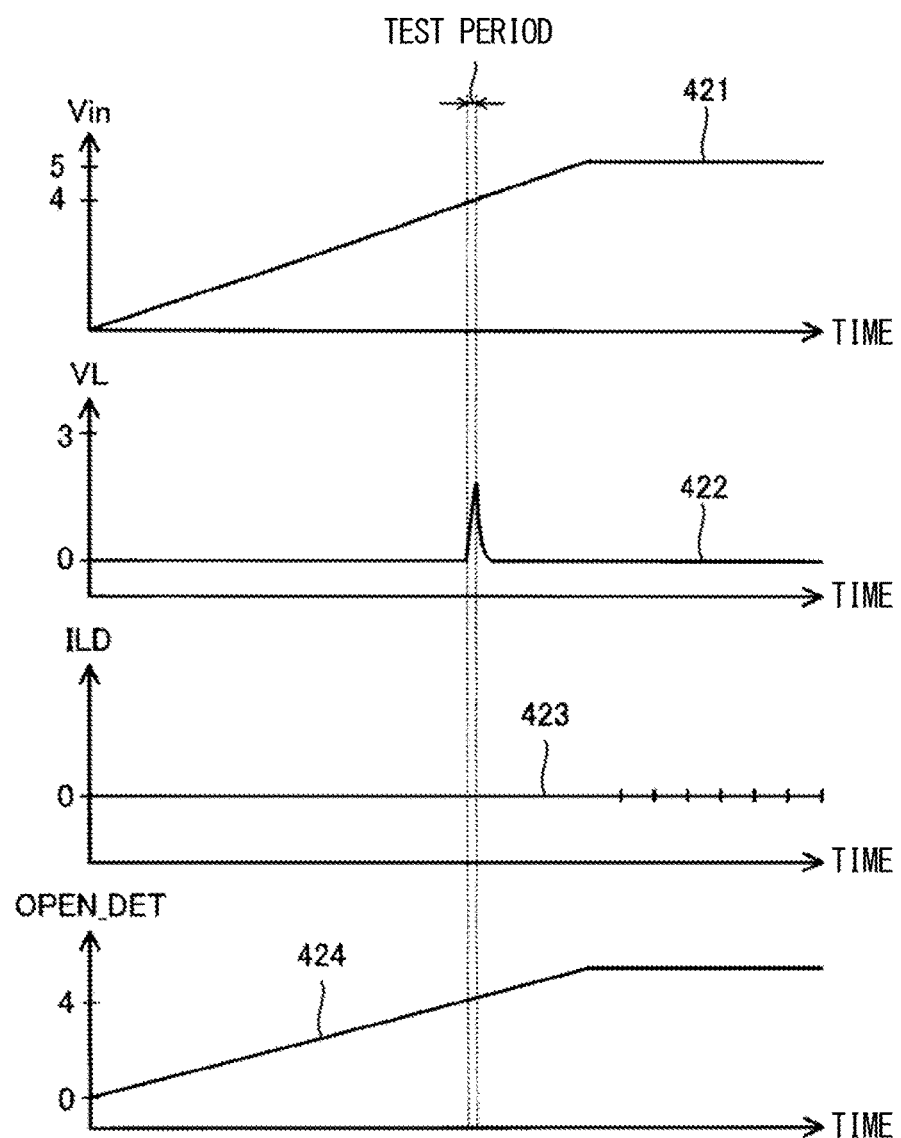
FIG. 11 is a waveform diagram of various types of voltages, a current, and a signal when the output capacitor is unconnected.

Next, with reference to FIGS. 11 and 12, a description is given of statuses of the signals in a state where the output capacitor Co is not connected (hereinafter, referred to as an output capacitor unconnected state). In FIG. 11, waveforms 421 to 424 are waveforms, in the output capacitor unconnected state, of the input voltage Vin, the voltage VL, the load current ILD, and the signal OPEN_DET, respectively. An example shown in FIGS. 11 and 12 also assumes that the input voltage Vin rises from 0 V to 5 V and then becomes stable.

Figure 12:
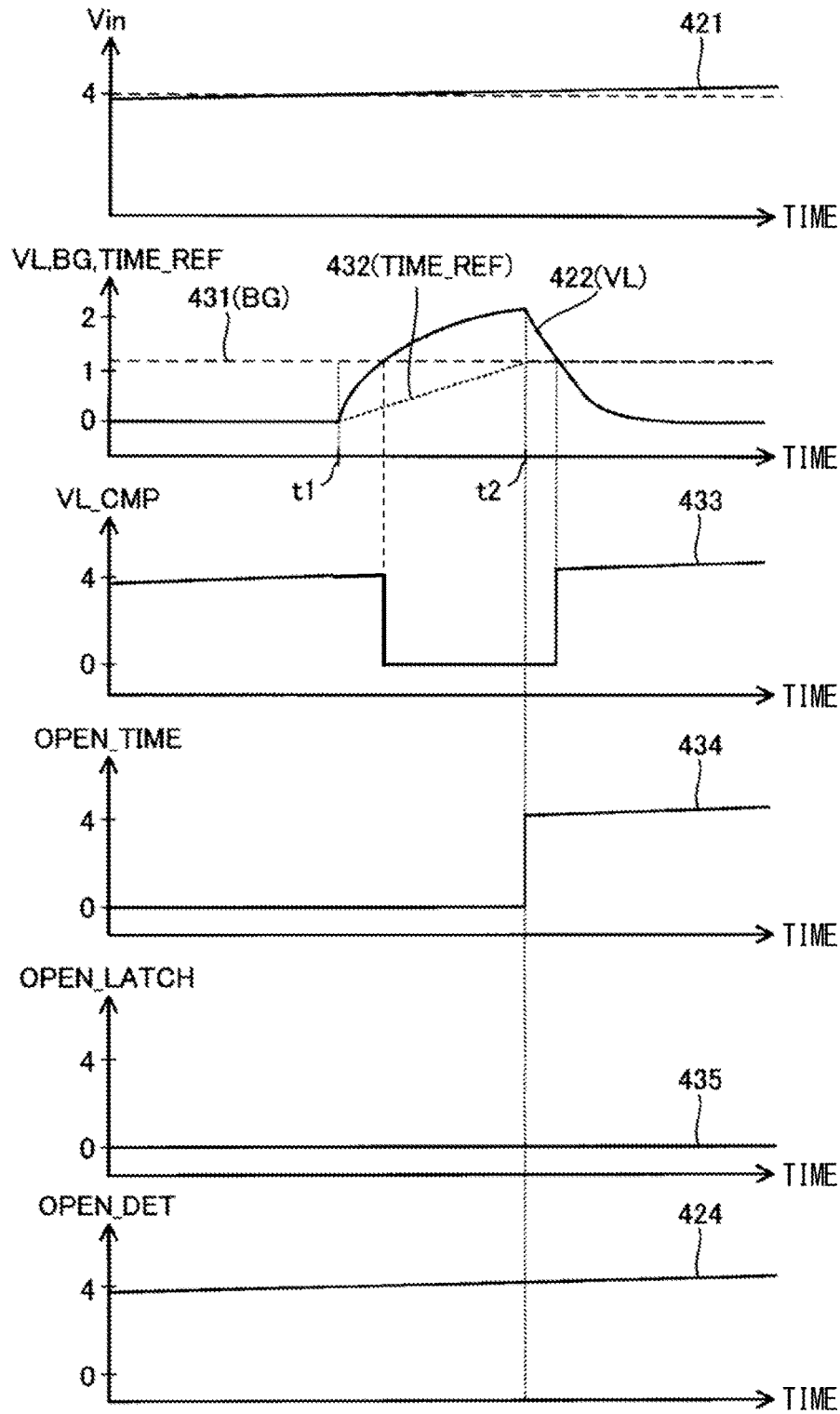
FIG. 12 is an enlarged waveform diagram of various types of voltages and signals when the output capacitor is unconnected.

FIG. 12 shows enlarged views of the waveforms 421, 422, and 424 in and around the test period. Furthermore, in FIG. 12, waveforms 431 to 435 are waveforms, in and around the test period in the output capacitor unconnected state, of the voltages BG and TIME_REF and the signals VL_CMP, OPEN_TIME, and OPEN_LATCH, respectively.

Upon the input voltage Vin rising from 0 V starting from a state, as a starting point, where both of the voltages TIME_REF and VL have a value of 0 V, first, while the signal UVLO is maintained to be low, the constant voltage BG and the constant current iu are generated and outputted. At this stage, since the signal UVLO_B is high, no current flows through the FETs 112 to 114. After that, upon the input voltage Vin reaching a predetermined UVLO release voltage (about 4 V) at a timing t1, the signal UVLO switches from low to high, as a result of which a constant current starts to flow through each of the FETs 113 and 114. At this stage, since the signal UVLO_B is low, the FET 117 is off. Accordingly, the constant current that passes through the FET 113 is used to charge the capacitor 123, thus gradually increasing the voltage TIME_REF (see the waveform 432). On the other hand, the constant current icc that passes through the FET 114 is used to charge the capacitor Ca, thus gradually increasing the voltage VL (see the waveform 422).

At a timing t2 when the voltage TIME_REF has become not lower than the constant voltage BG, the signal OPEN_TIME switches from low to high (see the waveform 434; in FIG. 12, the waveforms 431 and 432 coincide with each other after the timing t2). Upon the signal OPEN_TIME switching from low to high, the FET 111 is turned on through the NOR circuit 118, and thus supply of the constant current that has passed through the FET 113 and supply of the constant current icc that has passed through the FET 114 are stopped. A time length of the test period and a magnitude of the constant current icc are set so that, in the output capacitor unconnected state, in the test period, the voltage VL exceeds the constant voltage BG, and thus, as shown in FIG. 12, at a timing after the timing t1 and before the timing t2, the voltage VL exceeds the constant voltage BG. Because of this, the signal VL_CMP at the timing t2 is low (see the waveform 433). The latch circuit 121 latches a level of the signal VL_CMP at the timing t2 and outputs the signal OPEN_LATCH having the level thus latched. Accordingly, in the output capacitor unconnected state, both before the timing t2 and after the timing t2, the signal OPEN_LATCH is low. As a result, the signal OPEN_DET is maintained to be high, so that even if the input voltage Vin being supplied has a sufficiently high value, the power supply operation by the output circuit 20 is not started up (see FIG. 8).

As can be understood from the foregoing descriptions, the control circuit 30 according to the first example compares the test voltage VL (see FIG. 3) at a predetermined judgment timing in the test period with a predetermined judgment voltage. The judgment voltage has a predetermined positive value. When the test voltage VL at the judgment timing has a value smaller than that of the judgment voltage, the control circuit 30 judges that the output capacitor Co is connected and thus enables start-up of the power supply operation, and when the test voltage VL at the judgment timing has a value larger than that of the judgment voltage, the control circuit 30 judges that the output capacitor Co is not connected and thus disables start-up of the power supply operation. After completion of the test period, the signal OPEN_DET being low represents the start-up enabling signal and indicates a judgment result that the output capacitor Co is connected, and the signal OPEN_DET being high represents the start-up disabling signal and indicates a judgment result that the output capacitor Co is unconnected. While in the first example, the above-described judgment timing coincides with the timing t2 when the test period is completed, the judgment timing may be set to precede the timing when the test period is completed. In the first example, the constant voltage BG corresponds to the above-described judgment voltage, and the constant current icc corresponds to the above-described test current.

Figure 13:
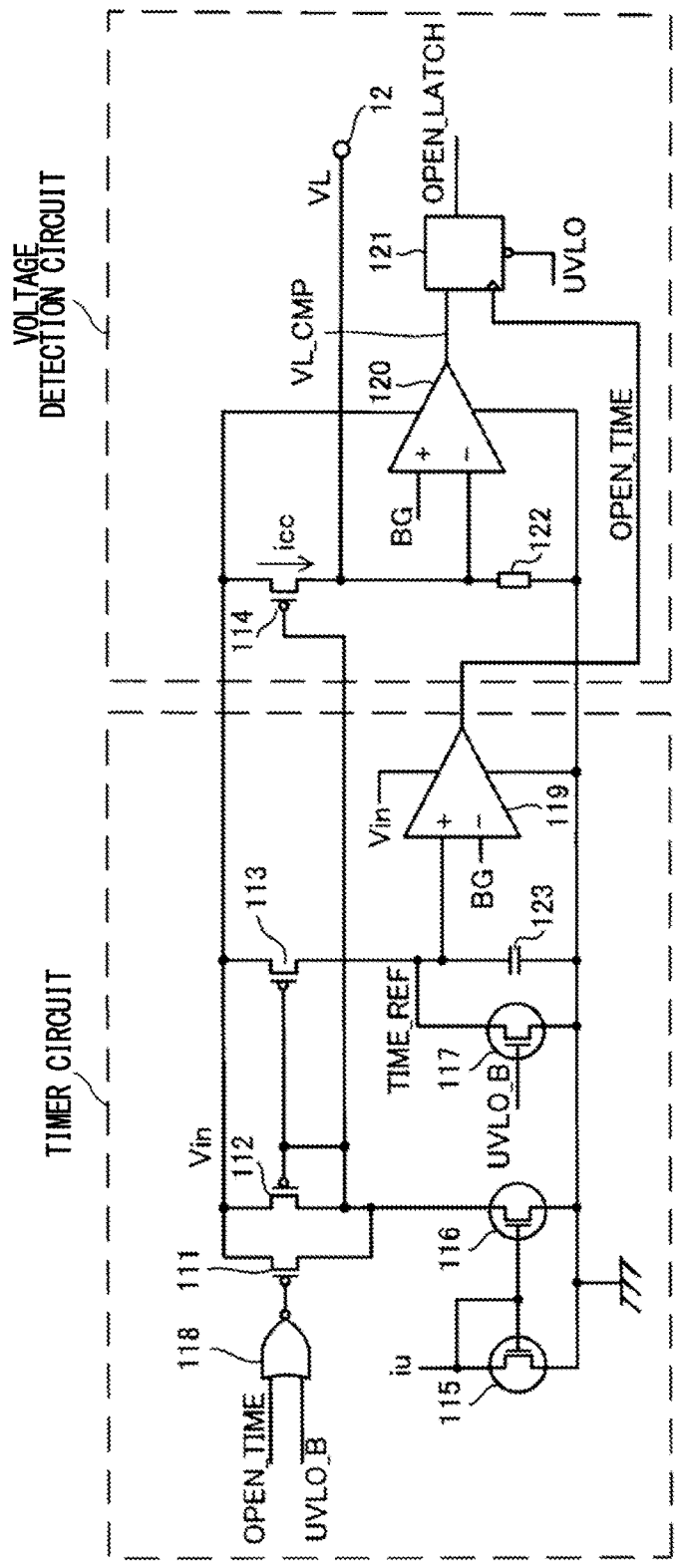
FIG. 13 is a partial circuit diagram of the power supply circuit according to the first example of the present invention.

It can be said that the control circuit 30 has a timer circuit that sets and measures the test period and a voltage detection circuit that detects the voltage VL in the test period (namely, the test voltage). For example, it can be considered that, as shown in FIG. 13, the timer circuit is formed to have the FETs 111 to 113 and the FETs 115 to 117, the NOR circuit 118, the comparator 119, and the capacitor 123, and the voltage detection circuit is formed to have the FET 114, the comparator 120, the latch circuit 121, and the resistor 122.

Every time the power supply operation is started up (every time an attempt is made to start up the power supply operation), the control circuit 30 judges whether or not the output capacitor Co is connected and, based on a result of the judgment, enables or disables the start-up (the same applies also in after-mentioned other examples).

Second Example

A description is given of a second example of the power supply circuit 1. A control circuit 30 according to the second example controls, based on a rate of change of the test voltage VL in the test period, whether or not to start up the power supply operation. This configuration also provides similar actions and effects to those obtained by the first example.

Specifically, also in the second example, a timer circuit as described above (see FIG. 13) and a FET 114 are provided in the control circuit 30, and in the test period, the constant current icc is supplied, via the output terminal 12, to each of the output capacitor Co and the parasite capacitor Ca or to the parasite capacitor Ca. The control circuit 30 detects a rate of change of a voltage VL in the test period (namely, the test voltage VL), and compares the rate of change of the test voltage VL thus detected with a predetermined judgment rate of change. The judgment rate of change has a predetermined positive value. For example, the rate of change of the test voltage VL can be detected based on voltage values of the test voltage VL at timings t1 and t2 and a time length between the timings t1 and t2.

Then, when the rate of change of the test voltage VL has a value smaller than that of the predetermined judgment rate of change, the control circuit 30 judges that the output capacitor Co is connected and thus enables start-up of the power supply operation (supplies the signal OPEN_DET being low to the output circuit 20), and when the rate of change of the test voltage VL has a value larger than that of the above-described judgment rate of change, the control circuit 30 judges that the output capacitor Co is not connected and thus disables start-up of the power supply operation (supplies the signal OPEN_DET being high to the output circuit 20).

Third Example

Figure 14:
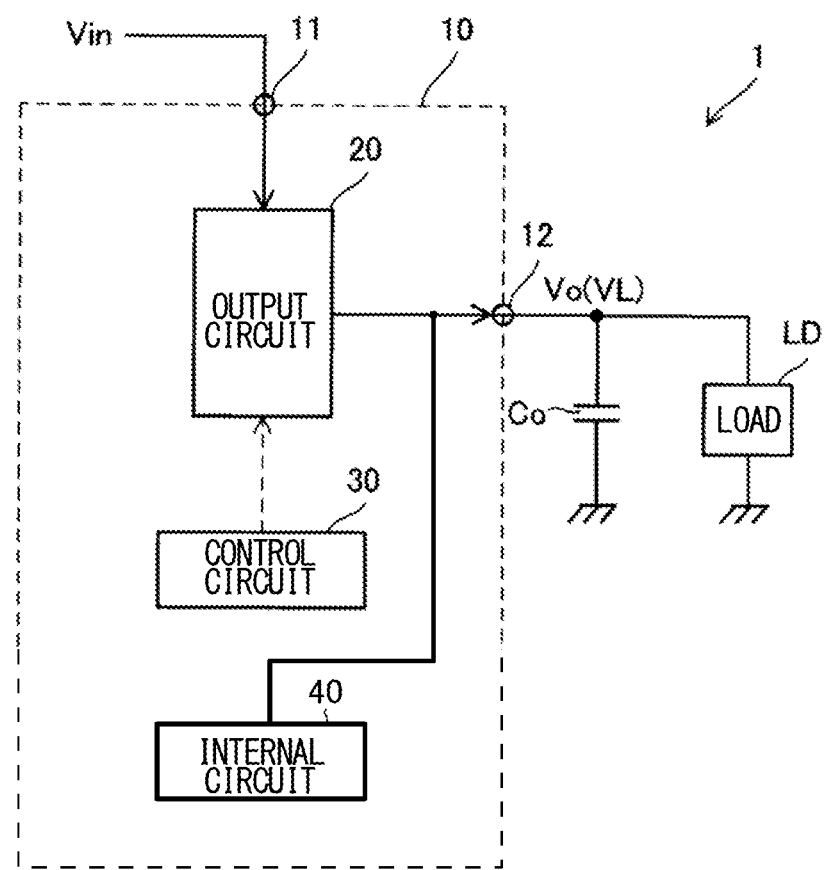
FIG. 14 is a schematic configuration diagram of a power supply circuit according to another embodiment of the present invention.

FIG. 14 is a schematic configuration diagram of a power supply circuit 1 according to another embodiment of the present invention. In the power supply circuit 1 in this configuration example, which has a substantially similar configuration to that in FIG. 1 mentioned earlier, an internal circuit 40 that operates by receiving supply of the output voltage Vo (VL) is integrated into an IC 10. For example, in a case where the IC 10 is a system power supply IC that generates output voltages Vout1 to VoutN of N systems (where N≥2) from the input voltage Vin, DC/DC converters of the N systems correspond to the internal circuit 40.

In the foregoing first or second example, in a state where the power supply operation by the output circuit 20 is stopped (VL=0 V), it is judged whether or not the output capacitor Co is connected. It is, therefore, not until this judgment processing is completed that power supply to the internal circuit 40 is started, which results in a delay in start-up of the internal circuit 40. Some applications incorporating the power supply circuit 1, however, demands that the internal circuit 40 be preferentially started up, and meeting this demand requires that in a state where the power supply operation by the output circuit 20 is being performed, it be judged whether or not the output capacitor Co is connected. A third example details specific configurations and operations for implementing the above-described judgment processing.

Figure 15:
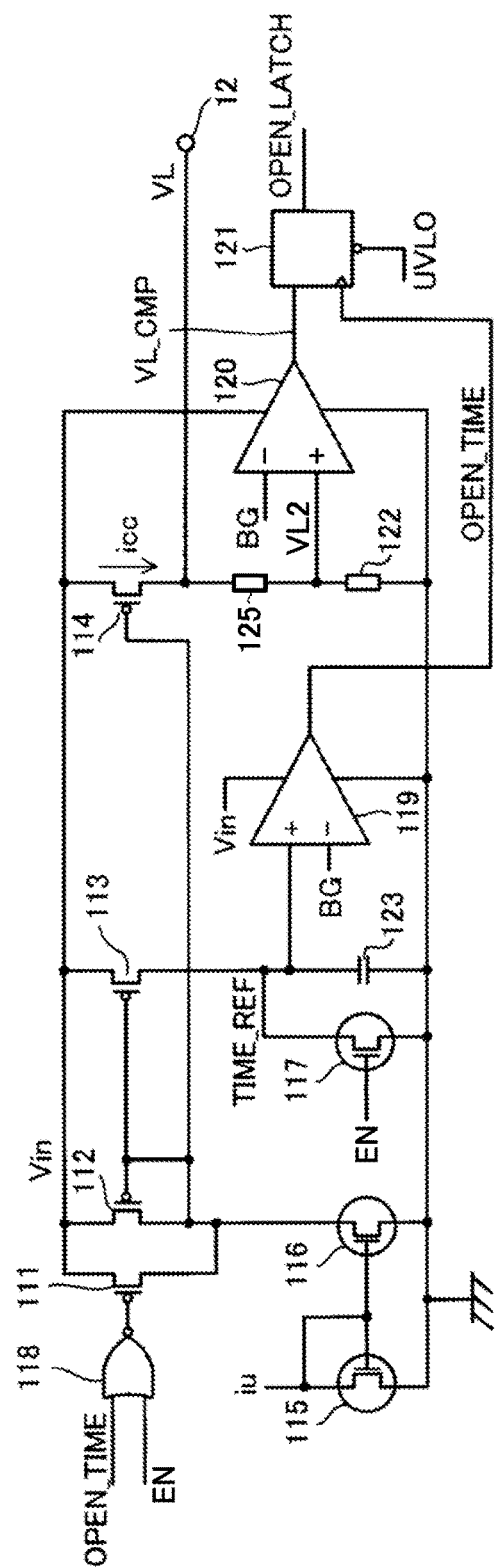
FIG. 15 is a partial circuit diagram of a power supply circuit according to a third example of the present invention.
Figure 16:
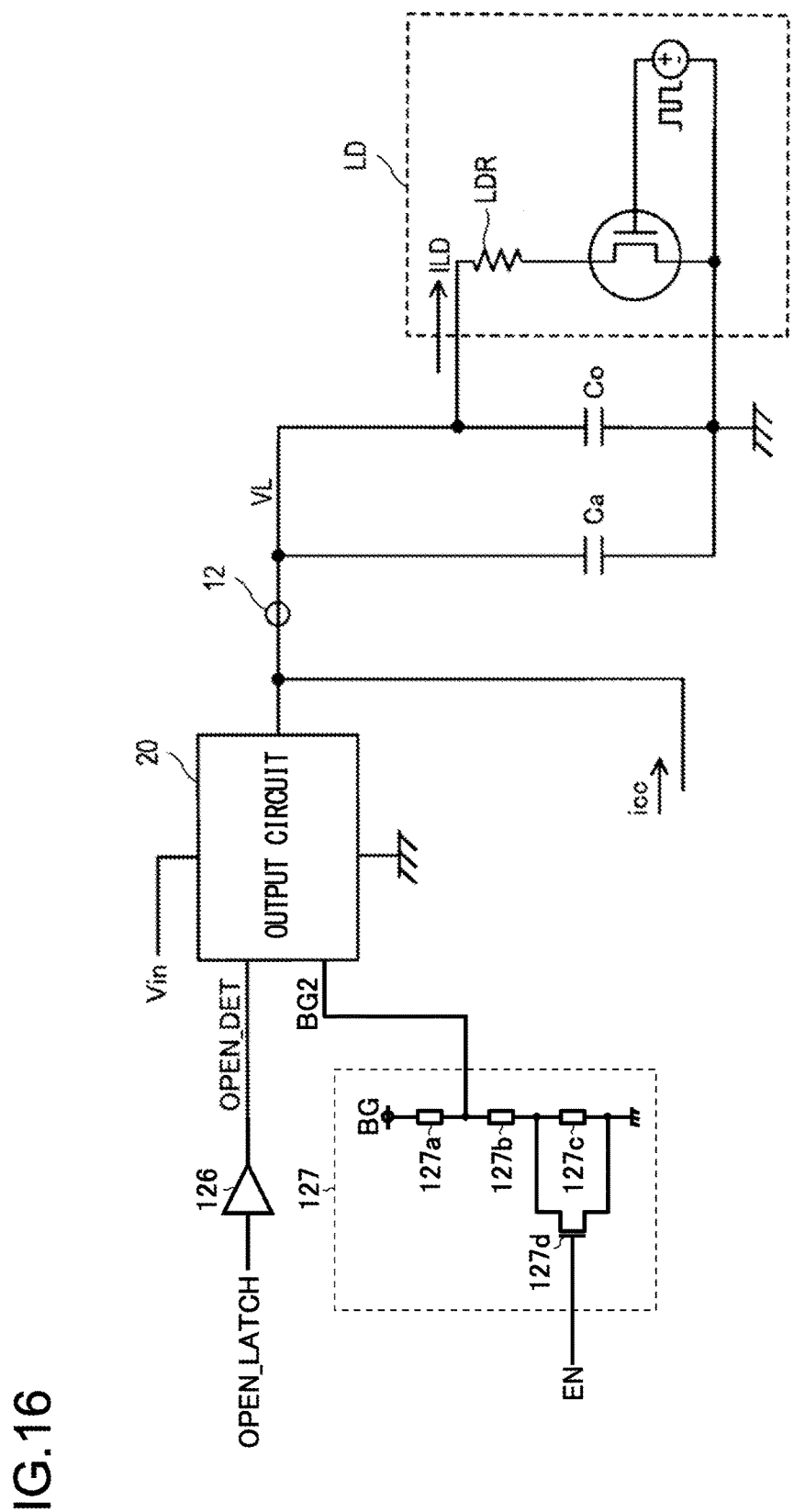
FIG. 16 is a partial circuit diagram of the power supply circuit according to the third example of the present invention.

FIGS. 15 and 16 are partial circuit diagrams of a power supply circuit 1 according to the third example and are to replace FIGS. 6 and 7 mentioned earlier. The partial circuit diagram of FIG. 5, on the other hand, is applicable as it is also to the power supply circuit 1 according to the third example. That is, configurations shown in FIGS. 5, 15, and 16, respectively, as a whole constitute the power supply circuit 1 according to the third example.

With regard to the partial circuit diagram of FIG. 15, changes from FIG. 6 made therein are described. First among the changes is that, instead of the signal UVLO_B, a signal EN is inputted to a gate of a FET 117. Second among the changes is that a two-input NOR (negative OR) circuit 118 outputs, instead of the negative OR signal of the signal OPEN_TIME and the signal UVLO_B, a negative OR signal of the signal OPEN_TIME and the signal EN, to a gate of a FET 111. Third among the changes is that a drain of a FET 114 (output terminal 12) is, instead of being directly connected to an input terminal of a comparator 120, connected to the input terminal of the comparator 120 via a resistor 125. That is, instead of the voltage VL being directly inputted to the input terminal of the comparator 120, a voltage VL2 obtained by dividing the voltage VL with the resistors 125 and 122 is inputted thereto. Fourth among the changes is that input polarities of the comparator 120 are reversed from those in an example shown in FIG. 6. That is, the voltage VL2 is inputted to a non-inverting input terminal of the comparator 120, and the constant voltage BG is inputted to an inverting input terminal of the comparator 120. Thus, the signal VL_CMP becomes high in level when the voltage VL2 is higher than the constant voltage BG and low in level when the voltage VL2 is lower than the constant voltage BG.

Next, with regard to the partial circuit diagram of FIG. 16, changes from FIG. 7 made therein are described. First among the changes is that, in place of the two-input NAND (negative AND) circuit 124 in FIG. 7, a buffer 126 that receives an input of the signal OPEN_LATCH and outputs the signal OPEN_DET is provided. That is, the signal OPEN_DET is equal in logic level to the signal OPEN_LATCH. Similarly to the foregoing, the signal OPEN_DET being high corresponds to the start-up disabling signal, and the signal OPEN_DET being low corresponds to the start-up enabling signal. Second among the changes is that there is additionally provided a voltage division circuit 127 that generates a divided constant voltage BG2 from the constant voltage BG and outputs the divided constant voltage BG2 to the output circuit 20. The output circuit 20 can generate, based on the divided constant voltage BG2, the reference voltage Vref, or can use the divided constant voltage BG2 as the reference voltage Vref.

The voltage division circuit 127 includes resistors 127a to 127c and an N-channel type MOSFET 127d. A first end of the resistor 127a is connected to an application end of the constant voltage BG. A second end of the resistor 127a and a first end of the resistor 127b are each connected, as an output end of the divided constant voltage BG2, to the output circuit 20. A second end of the resistor 127b is connected to a first end of the resistor 127c. A second end of the resistor 127c is connected to a ground end. A drain of the FET 127d is connected to the first end of the resistor 127c. A source of the FET 127d is connected to the second end (ground end) of the resistor 127c. A gate of the FET 127d is connected to an application end of the signal EN.

In the voltage division circuit 127 configured as above, when the signal EN is at a high level, the FET 127d is turned on to cause a short circuit across the resistor 127c. As a result, a voltage division ratio of the voltage division circuit 127 is lowered, so that the divided constant voltage BG2 is pulled down. Such a state corresponds to a state where the target value of the voltage VL (Vo) is set to a second target value (for example, 4.5 V) lower than a first target value (for example, 5 V). On the other hand, when the signal EN is at a low level, the FET 127d is turned off, and thus the resistor 127c is incorporated as a circuit component in the voltage division circuit 127. As a result, the voltage division ratio of the voltage division circuit 127 is raised, so that the divided constant voltage BG2 is pulled up. Such a state corresponds to a state where the target value of the voltage VL (Vo) is set to the first target value (for example, 5V).

When the voltage generation circuit 101 in FIG. 5 is outputting the constant voltage BG and also outputting the constant current iu, the constant current iu flows as a drain current of a FET 115 in FIG. 15. The FETs 115 and 116 are the same in their characteristics and constitute a current mirror circuit in which the FET 115 serves as a FET on a current input side. Accordingly, when the constant current iu is flowing through the FET 115, a drain current having the same current value as that of the constant current iu flows also through the FET 116. When at least one of the signals OPEN_TIME and EN is high, the FET 111 is turned on, and thus the drain current of the FET 116 flows via the FET 111, with no current flowing through the FET 112.

On the other hand, when both of the signals OPEN_TIME and EN are low, the FET 111 is turned off, and thus the drain current of the FET 116 (namely, the constant current) flows via the FET 112. The FETs 112 to 114 are the same in their characteristics and constitute a current mirror circuit in which the FET 112 serves as a FET on a current input side. Accordingly, when the constant current flows through the FET 112, a constant current depending on the current flowing through the FET 112 flows also through each of the FETs 113 and 114. When the FET 117 is off (EN=L), the constant current that passes through the FET 113 is used to charge the capacitor 123. The constant current icc that passes through the FET 114 is used to charge the parasite capacitor Ca and the output capacitor Co or to charge the parasite capacitor Ca. The aforementioned test period corresponds to a period in which the constant current icc flows.

Figure 17:
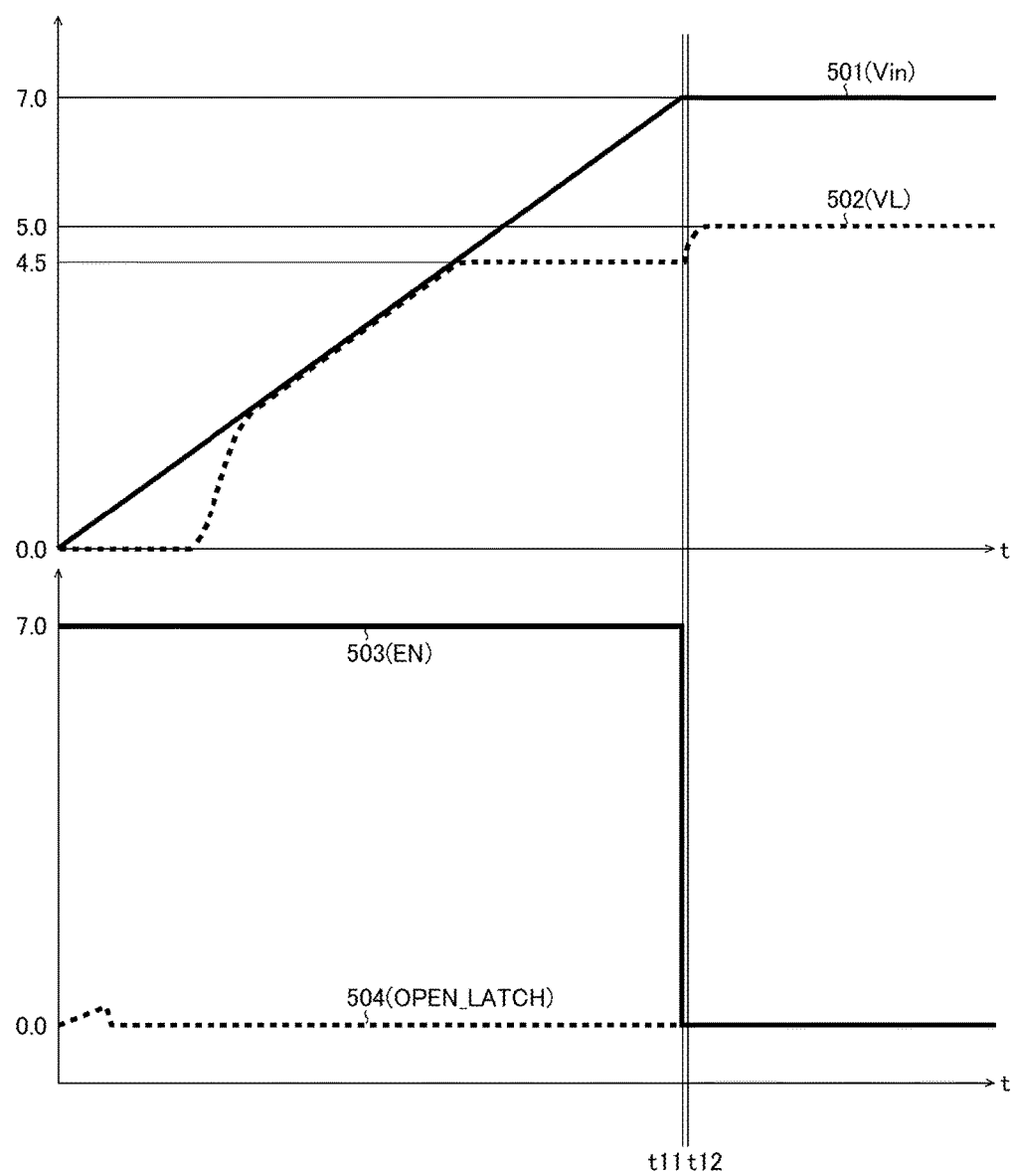
FIG. 17 is a waveform diagram of various types of voltages and signals when the output capacitor is connected.
Figure 18:
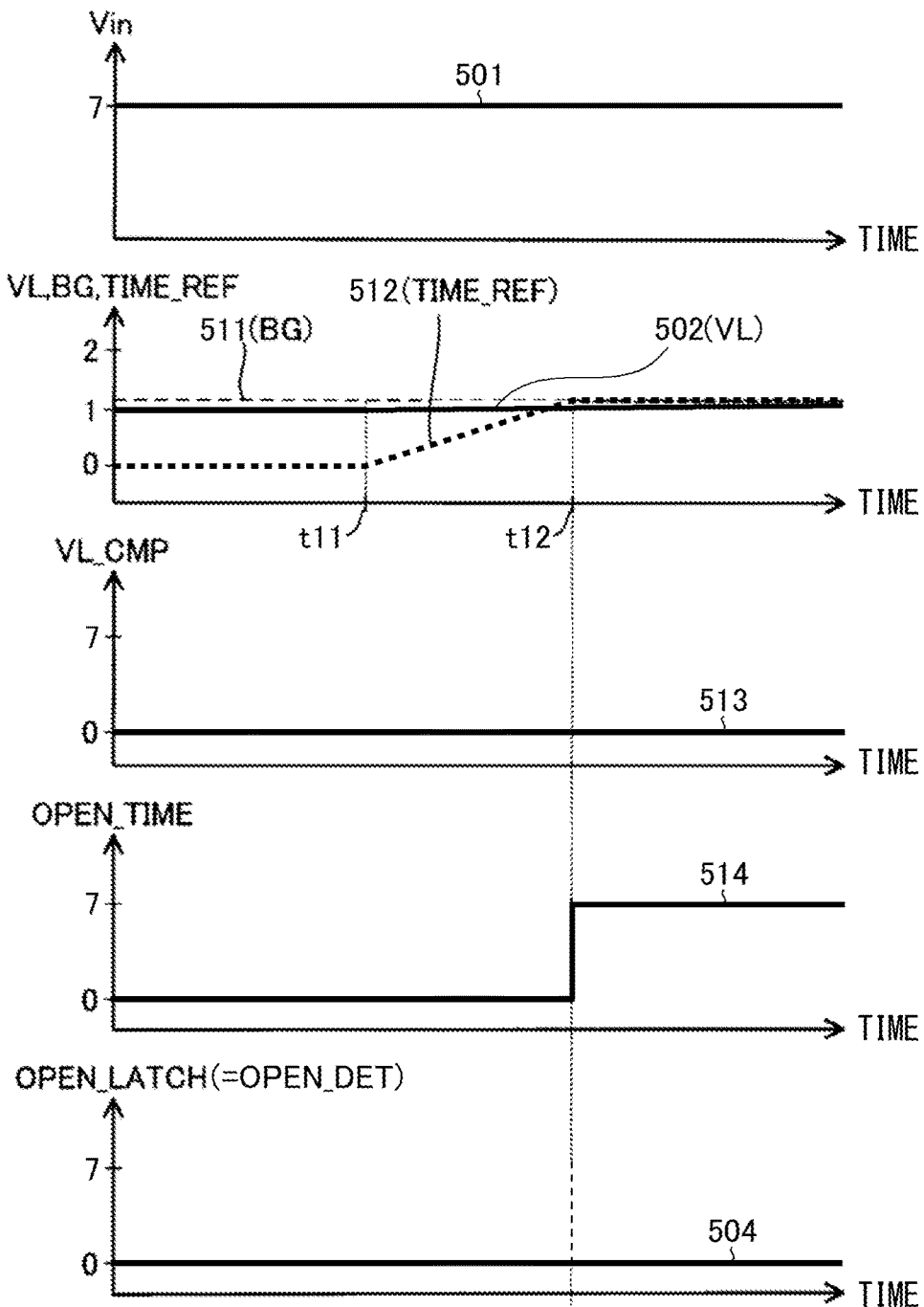
FIG. 18 is an enlarged waveform diagram of various types of voltages and signals when the output capacitor is connected.

With reference to FIGS. 17 and 18, a description is given of statuses of the signals around the test period (t11 to t12) in the output capacitor connected state. In FIG. 17, waveforms 501 to 504 are waveforms, in the output capacitor connected state, of the input voltage Vin, the voltage VL, the signal EN, and the signal OPEN_LATCH (=OPEN_DET), respectively. An example shown in FIGS. 17 and 18 assumes that the input voltage Vin rises from 0 V to 7 V and then becomes stable.

Furthermore, it is assumed that when the signal EN is at a high level (when the FET 127d in FIG. 16 is on), the target value of the voltage VL (Vo) is set to 4.5 V (any value not lower than an operation lower limit voltage of the internal circuit 40), whereas when the signal EN is at a low level (when the FET 127d in FIG. 16 is off), the target value of the voltage VL (Vo) is set to 5 V (which is an original target value).

Furthermore, a resistance ratio between the resistors 125 and 122 in FIG. 15 is set so that when the voltage VL (Vo) has become higher than the predetermined judgment voltage (for example, 4.75 V), the voltage VL2 surpasses the constant voltage BG (for example, 1.17 V).

FIG. 18 shows enlarged views of the waveforms 501, 502, and 504 in and around the test period. Furthermore, in FIG. 18, waveforms 511 to 514 are waveforms, in and around the test period in the output capacitor connected state, of the voltages BG and TIME_REF and the signals VL_CMP and OPEN_TIME, respectively.

Upon the input voltage Vin rising from 0 V starting from a state, as a starting point, where both of the voltages TIME_REF and VL have a value of 0 V, first, generation and outputting of the constant voltage BG and the constant current iu are started. At this stage (before the timing t11), since the signal EN is at a high level and thus the FET 111 is on, no current flows through the FETs 112 to 114. Furthermore, before the timing t11, since the FET 117 is on and the voltage TIME_REF has a value of 0 V (<BG), the signal OPEN_TIME is at a low level. Furthermore, before the timing t11, the voltage VL2 is lower than the constant voltage BG, so that the signal VL_CMP is at a low level, and hence the signal OPEN_LATCH (=OPEN_DET) is at a low level, which results in a state where the power supply operation by the output circuit 20 is enabled. Thus, as the input voltage Vin rises, the voltage VL also rises and then is maintained at the target value (4.5 V) thereof in a case where the signal EN is at a high level.

Thereafter, at the timing t11, the signal EN is made to fall to a low level, and thus the FET 111 is turned off, so that a constant current starts to flow through each of the FETs 112 to 114. Furthermore, when the signal EN is made to fall to a low level, the FET 117 is turned off, and thus the constant current that passes through the FET 113 is used to charge the capacitor 123, thus gradually increasing the voltage TIME_REF (see the waveform 512). On the other hand, the constant current icc that passes through the FET 114 is used to charge the capacitors Ca and Co, thus gradually increasing the voltage VL. In this case, however, since the capacitor Co has a sufficiently large capacitance, even when the constant current icc flows therethrough, the voltage VL hardly irises, and the voltage VL2 obtained by dividing the voltage VL also is kept in a state of being lower than the constant voltage BG.

When the signal EN is made to fall to a low level, the FET 127d is turned off, and thus the target value of the voltage VL (Vo) is pulled up from 4.5 V to the original target value of 5 V. In this case, however, in view of the fact that a response speed of the output circuit 20 is not so high, the test period (t11 to t12) is preset to be sufficiently short so that even when the target value of the voltage VL (Vo) is pulled up, in no case does the voltage LV2 surpass the constant voltage BG in the test period. That is, it can be said that a test current (icc) is a predominant factor responsible for a rise of the voltage VL (Vo) in the test period.

Then, at the timing t12 when the voltage TIME_REF has become not lower than the constant voltage BG, the signal OPEN_TIME switches from low to high (see the waveform 514; in FIG. 18, after the timing t12, the waveforms 511 and 512 coincide with each other). Upon the signal OPEN_TIME switching from low to high, the FET 111 is turned on through the NOR circuit 118, and thus supply of the constant current that has passed through the FET 113 and supply of the constant current icc that has passed through the FET 114 are stopped. Since in the output capacitor connected state, the output capacitor Co has a sufficiently large capacitance with respect to a total amount of the constant current icc in the test period, the voltage VL2 at the timing t12 is lower than the constant voltage BG. Because of this, the signal VL_CMP at the timing t12 is kept low (see the waveform 513). The latch circuit 121 latches a level of the signal VL_CMP at the timing t12 and outputs the signal OPEN_LATCH having the level thus latched. Accordingly, in the output capacitor connected state, at the timing t12, the signal OPEN_LATCH is kept low. As a result, the signal OPEN_DET also is kept low, so that the power supply operation by the output circuit 20 is continuously performed.

Figure 19:
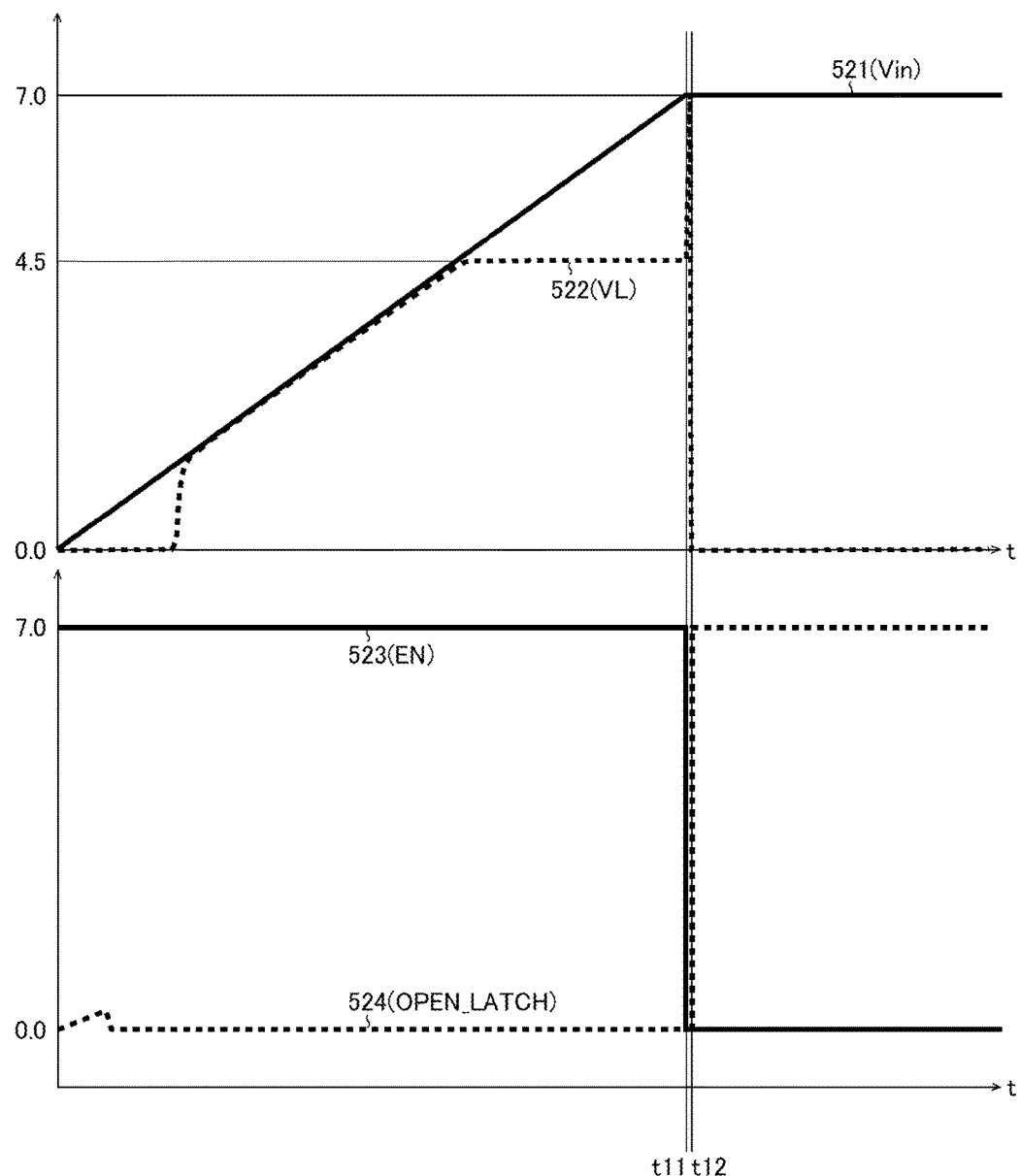
FIG. 19 is a waveform diagram of various types of voltages and signals when the output capacitor is unconnected.
Figure 20:
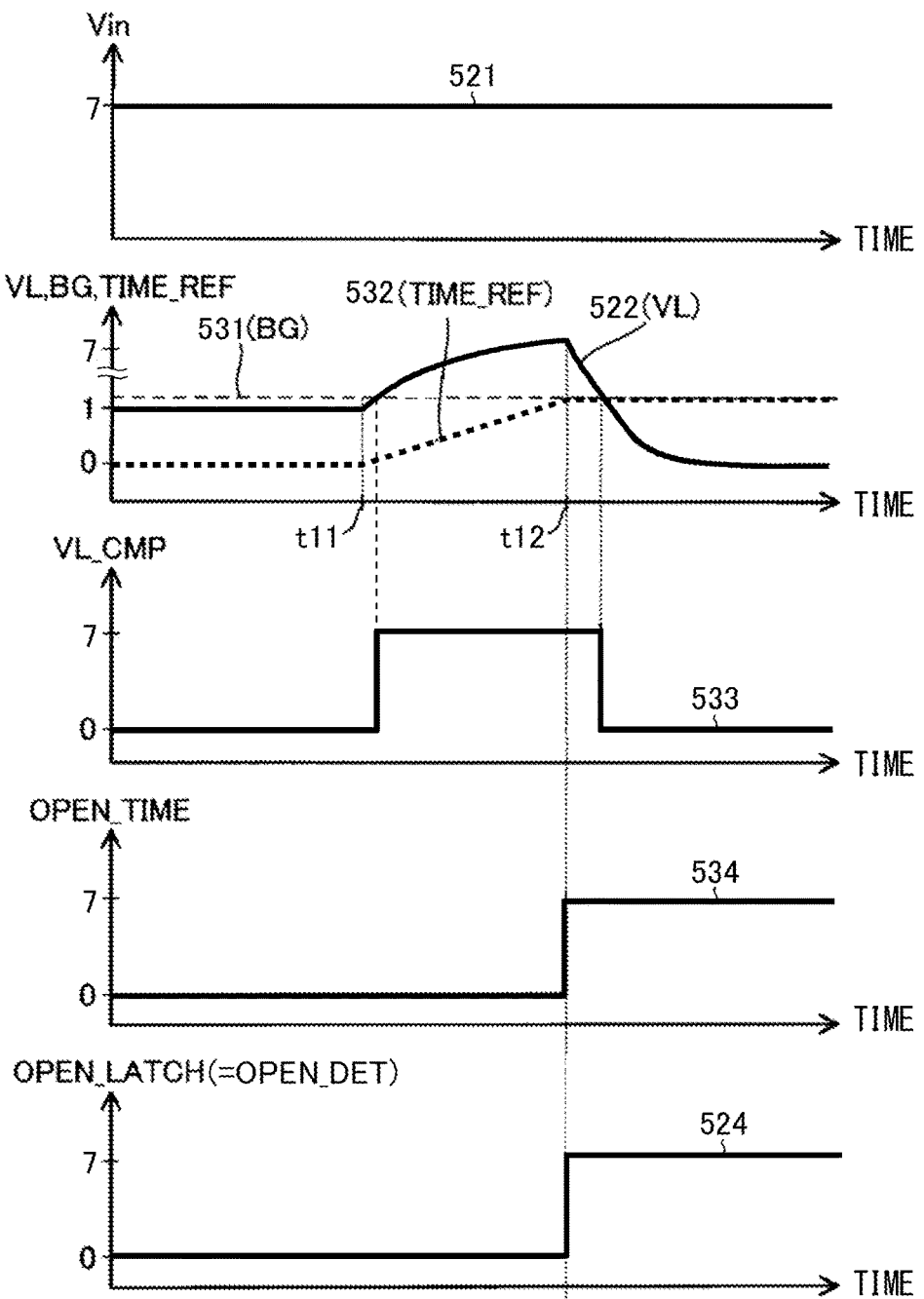
FIG. 20 is an enlarged waveform diagram of various types of voltages and signals when the output capacitor is unconnected.

Next, with reference to FIGS. 19 and 20, a description is given of statuses of the signals around the test period (t11 to t12) in the output capacitor unconnected state. In FIG. 19, waveforms 521 to 524 are waveforms, in the output capacitor unconnected state, of the input voltage Vin, the voltage VL, the signal EN, and the signal OPEN_LATCH (=OPEN_DET), respectively. An example shown in FIGS. 19 and 20 also assumes that the input voltage Vin rises from 0 V to 7 V and then becomes stable.

FIG. 20 shows enlarged views of the waveforms 521, 522, and 524 in and around the test period. Furthermore, in FIG. 20, waveforms 531 to 534 are waveforms, in and around the test period in the output capacitor unconnected state, of the voltages BG and TIME_REF and the signals VL_CMP and OPEN_TIME, respectively.

Behaviors of these voltages and signals before the timing t11 are similar to those (when the output capacitor is connected) in FIG. 17 mentioned earlier, and duplicate descriptions thereof, therefore, are omitted.

Thereafter, at the timing t11, the signal EN is made to fall to a low level, and thus the FET 111 is turned off, so that a constant current starts to flow through each of the FET 112 to 114. Furthermore, when the signal EN is made to fall to a low level, the FET 117 is turned off, and thus the constant current that passes through the FET 113 is used to charge the capacitor 123, thus gradually increasing the voltage TIME_REF (see the waveform 532). On the other hand, the constant current icc that passes through the FET 114 is used to charge the capacitor Ca, thus increasing the voltage VL. At this time, since the capacitor Co is not connected to the output terminal 12, when the constant current icc flows, the voltage VL jumps sharply to a neighborhood of the input voltage Vin.

Then, at the timing t2 when the voltage TIME_REF has become not lower than the constant voltage BG, the signal OPEN_TIME switches from low to high (see the waveform 534; In FIG. 20, after the timing t2, the waveforms 531 and 532 coincide with each other). Upon the signal OPEN_TIME switching from low to high, the FET 111 is turned on through the NOR circuit 118, and thus supply of the constant current that has passed through the FET 113 and supply of the constant current icc that has passed through the FET 114 are stopped. A time length of the test period and a magnitude of the constant current icc are set so that, in the output capacitor unconnected state, in the test period, the voltage VL2 exceeds the constant voltage BG, and thus, as shown in FIG. 20, at a timing after the timing t11 and before the timing t12, the voltage VL2 exceeds the constant voltage BG. Because of this, the signal VL_CMP at the timing t12 is high (see the waveform 533). The latch circuit 121 latches a level of the signal VL_CMP at the timing t12 and outputs the signal OPEN_LATCH having the level thus latched. Accordingly, in the output capacitor unconnected state, at the timing t12, the signal OPEN_LATCH rises form low to high. As a result, the signal OPEN_DET also rises from low to high, and thus even when the input voltage Vin being sufficiently high is being supplied, the power supply operation by the output circuit 20 is disabled.

As described above, a control circuit 30 according to the third example judges, after the power supply operation by the output circuit 20 is started up, whether or not the output capacitor Co is connected, and controls, based on a result of the judgment, whether or not to continuously perform the power supply operation by the output circuit 20. With this configuration in which, in a state where the power supply operation by the output circuit 20 is being performed, it is judged whether or not the output capacitor Co is connected, it becomes possible to preferentially start up the internal circuit 40 that operates by receiving supply of the voltage VL (Vo).

Furthermore, the control circuit 30 according to the third example presets, at the time of start-up of the power supply operation, the target value of the output voltage VL (Vo) to a second target value (for example, 4.5 V) lower than a first target value (for example, 5V), and switches, at the time of starting the test period, the target value of the output voltage VL (Vo) from the second target value to the first target value. With this configuration, as long as the output capacitor Vo is properly connected to the output terminal 12, even when the test current icc is fed, in no case does the voltage VL (Vo) exceed the first target value, which is an original target value, and this prevents an excessive voltage from being applied to the load LD.

A timing for switching the target value of the output voltage VL (Vo) may be set to, without being limited to the time of starting the test period (the time when EN=L), the time of completing the test period (the time when OPEN_TIME=H). In a case of implementing a sequence for this purpose, it is appropriate to input a logic-inverted signal of the signal OPEN_TIME to the gate of the transistor 117.

Furthermore, while in the third example, immediately after the input voltage Vin has become stable at 7 V, the signal EN is made to fall to a low level, and the test period is started in that state, a start timing of the test period is not limited thereto. In judging whether or not the output capacitor Co is connected, there is performed comparison judgment between the voltage VL2 and the constant voltage BG, which, in fact, is nothing but comparison judgment between the voltage VL (Vo) and a predetermined judgment voltage (for example, 4.75 V). From this viewpoint, the test period may be started basically at any timing after the time when the input voltage Vin surpasses the above-described judgment voltage.

Furthermore, the third example represents a configuration in which, as in the foregoing first example, a comparison is made between the test voltage VL and a predetermined judgment voltage at a predetermined judgment timing in the test period, and based on a result of the comparison, it is controlled whether or not to enable the power supply operation. A method for judging whether or not the output capacitor Co is connected is not limited thereto, and a configuration may be adopted in which, as in the foregoing second example, based on a rate of change of the test voltage VL in the test period, it is controlled whether or not to start up the power supply operation.

Fourth Example

The power supply circuit 1 can be incorporated into an arbitrary electronic device. In this case, it is appropriate that all or some of electric components in the electronic device be driven by using the output voltage Vo. The electronic device is an arbitrary device that is capable of, for example, acquiring, reproducing, or processing arbitrary information, such as, for example, a display panel, a magnetic disc device (magnetic disc storage device), an optical disc device (for example, a data storage/reproduction device using a DVD (digital versatile disc) or a BD (Blu-ray (registered trademark) disc)), a personal computer, a mobile phone, an information terminal, an electronic book reader, an electronic dictionary, a digital camera, a game machine, or a navigation device. The display panel is, for example, a liquid crystal display panel, an organic EL (organic electro-luminescence) display panel, or a plasma display panel.

Figure 21:
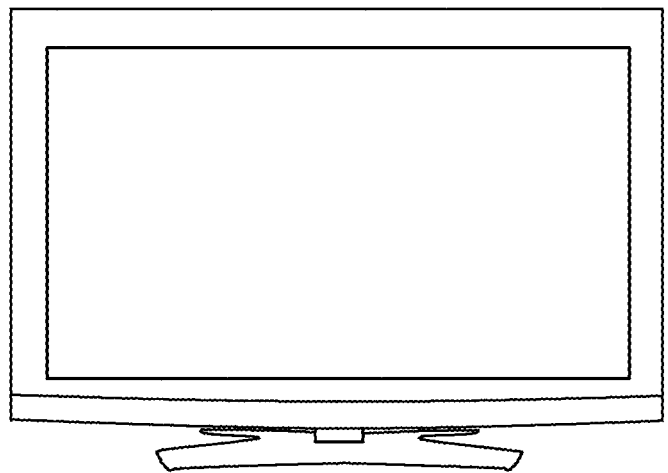
FIG. 21 is an outer appearance view of a liquid crystal television set according to a fourth example of the present invention.
Figure 22:
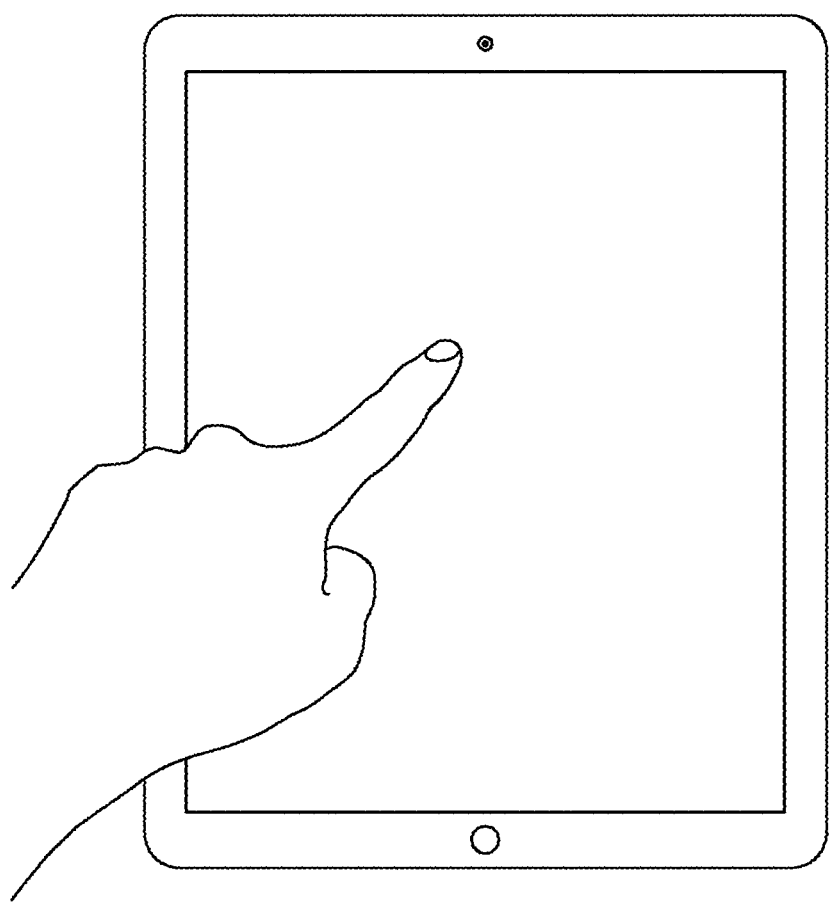
FIG. 22 is an outer appearance view of a tablet terminal according to the fourth example of the present invention.

In a case where the electronic device incorporating the power supply circuit 1 is a display panel itself or an electronic device including the display panel, the output voltage Vo of the power supply circuit 1 can be used as a drive voltage for the display panel. The electronic device incorporating the power supply circuit 1 and including the display panel is, for example, a television set (a liquid crystal television set or the like) as shown in FIG. 21, a tablet terminal as shown in FIG. 22, a notebook personal computer, or a smart phone.

<<Modifications and Variations>>

The embodiments of the present invention can be variously modified as appropriate within the scope of the technical ideas recited in the appended claims. The foregoing embodiments are illustrative only of embodied forms of the present invention, and the present invention and the meanings of the terms used to indicate the constituent components are not limited to those described in the foregoing embodiments. Specific numerical values presented in the foregoing descriptions are merely illustrative and, naturally, can be changed to different numerical values. Additional comments applicable to the foregoing embodiments will be given below in notes 1 to 6. Unless inconsistent, any part of these notes can be arbitrarily combined with any other part.

[Note 1]

Specific circuit configurations shown in FIG. 2, FIGS. 5 to 7, and FIGS. 15 and 16 can be variously modified. For example, while there is exemplarily shown, with reference to FIG. 2, the internal circuit of the output circuit 20, which forms a linear regulator, as long as the power supply circuit according to the present invention is classified as a linear regulator, the internal circuit of the output circuit 20 can be variously modified.

[Note 2]

The aforementioned circuits can be modified as appropriate so that the N-channel type FET is replaced with a P-channel type FET or so that the P-channel type FET is replaced with an N-channel type FET.

[Note 3]

The MOSFET in the aforementioned circuits may be replaced with a junction field-effect transistor (JFET) or a bipolar transistor. In a case where the bipolar transistor is used in place of the MOSFET, it is appropriate that, in the foregoing descriptions, the terms "gate" (control terminal), "drain", and "source" be replaced with their equivalent terms "base" (control terminal), "collector", and "emitter", respectively.

[Note 4]

The power supply circuit 1 may have a modified configuration in which the input voltage Vin and the output voltage Vo are negative voltages. In each of a case where the input voltage Vin and the output voltage Vo are positive voltages and a case where the input voltage Vin and the output voltage Vo are negative voltages, the test voltage VL being smaller or larger than the judgment voltage means that an absolute value of the test voltage VL is smaller or larger than an absolute value of the judgment voltage, and a rate of change of the test voltage VL being smaller or larger than a judgment rate of change means that an absolute value of the rate of change of the test voltage VL is smaller or larger than an absolute value of the judgment rate of change.

In a case where, in the first and third examples, the test voltage VL at the above-described judgment timing is equal to a predetermined judgment voltage or in a case where, in the second example, a rate of change of the test voltage VL is equal to a predetermined judgment rate of change, the control circuit 30 may judge that the output capacitor Co is connected and thus enable the power supply operation or may judge that the output capacitor Co is not connected and thus disable the power supply operation.

[Note 5]

The power supply circuit according to the present invention may be formed as a switching regulator. In a power supply operation performed in the switching regulator, switching of an output transistor connected to an input terminal 11 or an output terminal 12 is performed (alternate switching thereof between on and off is performed), so that an output voltage Vo is obtained.

[Note 6]

For example, the following consideration is possible. The IC 10 is a semiconductor device including an integrated circuit for forming the aforementioned power supply circuit 1. The electronic device described in the fourth example includes the semiconductor device. The IC 10 may further include any other circuit (for example, a circuit for another power supply circuit) than the circuit forming the aforementioned power supply circuit 1.

What is claimed is:

1. A power supply circuit, comprising:
an output circuit that generates an output voltage by performing a power supply operation based on an input voltage;
an output terminal to which, after start-up of the power supply operation, the output voltage is applied; and a control circuit that sets a test period in which a predetermined test current is caused to flow between the output terminal and a reference potential line, detects, as a test voltage, a voltage at the output terminal in the test period, and controls, based on the test voltage, whether or not to enable the power supply operation,
wherein the control circuit judges, based on the test voltage, whether or not an output capacitor having a capacitance not less than a predetermined capacitance is connected to the output terminal, and controls, based on a result of the judgment, whether or not to enable the power supply operation,
wherein the control circuit judges, after start-up of the power supply operation, whether or not the output capacitor is connected, and controls, based on a result of the judgment, whether or not to continuously perform the power supply operation, and
wherein the control circuit presets, at a time of start-up of the power supply operation, a target value of the output voltage to a second target value lower than a first target value, and switches, at a time of starting or completing the test period, the target value of the output voltage from the second target value to the first target value.

2. The power supply circuit according to claim 1, wherein the control circuit makes a comparison between the test voltage at a predetermined judgment timing in the test period and a predetermined judgment voltage, and, based on a result of the comparison, controls whether or not to enable the power supply operation.

3. The power supply circuit according to claim 2, wherein the control circuit enables the power supply operation when the test voltage at the judgment timing has a value smaller than that of the judgment voltage, and disables the power supply operation when the test voltage at the judgment timing has a value larger than that of the judgment voltage.

4. The power supply circuit according to claim 1, wherein the control circuit controls, based on a rate of change of the test voltage in the test period, whether or not to enable the power supply operation.

5. The power supply circuit according to claim 4, wherein the control circuit enables the power supply operation when the rate of change has a value smaller than that of a predetermined judgment rate of change, and disables the power supply operation when the rate of change has a value larger than that of the predetermined judgment rate of change.

6. The power supply circuit according to claim 1, wherein in the test period, the control circuit causes a predetermined constant current as the test current to flow between the output terminal and the reference potential line.

7. The power supply circuit according to claim 1, wherein the control circuit judges, before start-up of the power supply operation, whether or not the output capacitor is connected, and controls, based on a result of the judgment, whether or not to start up the power supply operation.

8. The power supply circuit according to claim 1, further comprising: an internal circuit that operates by receiving supply of the output voltage.

9. The power supply circuit according to claim 1, wherein every time the power supply operation is started up, the control circuit judges whether or not the output capacitor is connected.

10. The power supply circuit according to claim 1, wherein the power supply circuit is formed as a linear regulator.

11. A semiconductor device, comprising: an integrated circuit for forming the power supply circuit according to claim 1.

12. An electronic device, comprising: the semiconductor device according to claim 11.

* * * * *